(12) United States Patent  
Iguchi et al.

(10) Patent No.: US 10,340,243 B2  
(45) Date of Patent: Jul. 2, 2019

(54) CIRCUIT SUBSTRATE AND METHOD FOR MANUFACTURING CIRCUIT SUBSTRATE

(71) Applicants: FUJI XEROX CO., LTD., Tokyo (JP); NODA SCREEN CO., LTD., Komaki-shi, Aichi (JP)

(72) Inventors: Daisuke Iguchi, Ebina (JP); Atsunori Hattori, Komaki (JP)

(73) Assignees: FUJI XEROX CO., LTD., Tokyo (JP); NODA SCREEN CO., LTD., Komaki-shi, Aichi (JP)

( * ) Notice: Subject to any disclaimer, the term of this patent is extended or adjusted under 35 U.S.C. 154(b) by 0 days.

(21) Appl. No.: 16/004,486

(22) Filed: Jun. 11, 2018

(65) Prior Publication Data

US 2018/0294240 A1 Oct. 11, 2018

Related U.S. Application Data

(62) Division of application No. 15/421,018, filed on Jan. 31, 2017, now Pat. No. 10,020,277.

(30) Foreign Application Priority Data

Feb. 3, 2016 (JP) ................................. 2016-019170

(51) Int. Cl.
*H01L 21/48* (2006.01)
*H01L 23/00* (2006.01)
(Continued)

(52) U.S. Cl.
CPC .......... *H01L 24/17* (2013.01); *H01L 21/4875* (2013.01); *H01L 23/492* (2013.01);
(Continued)

(58) Field of Classification Search
CPC . H01L 33/62; H01L 51/5056; H01L 51/5072; H01L 51/56; H01L 51/5092
(Continued)

(56) References Cited

U.S. PATENT DOCUMENTS 5,177,670 A  1/1993 Shinohara et al.
6,166,457 A 12/2000 Iguchi et al.
(Continued)

FOREIGN PATENT DOCUMENTS

CN       1113584 C    7/2003
JP    2000216282 A    8/2000
(Continued)

OTHER PUBLICATIONS

Office Action dated Sep. 8, 2017 issued by the Taiwanese Patent Office in counterpart Taiwanese Patent Application No. 106103254.
(Continued)

*Primary Examiner* — Andy Huynh
(74) *Attorney, Agent, or Firm* — Sughrue Mion, PLLC

(57) ABSTRACT

A circuit substrate includes: a base material; and a capacitor layer. The capacitor layer includes a first metal layer that is provided on the base material, a dielectric layer that is provided on the first metal layer, and a second metal layer that is provided on the dielectric layer. The first metal layer includes a first electrode region which is provided on the base material and is exposed from the dielectric layer and to which a first terminal of a capacitor element for supplying current to a circuit part through the capacitor layer is connected. The second metal layer includes a second electrode region in which the second metal layer is exposed and to which a second terminal of the capacitor element is connected.

20 Claims, 19 Drawing Sheets

(51) Int. Cl.
  *H01L 25/00* (2006.01)
  *H01L 25/16* (2006.01)
  *H01L 23/492* (2006.01)
  *H01L 23/522* (2006.01)
  *H01L 23/528* (2006.01)
  *H01L 23/532* (2006.01)

(52) U.S. Cl.
  CPC ........ *H01L 23/528* (2013.01); *H01L 23/5223* (2013.01); *H01L 23/53214* (2013.01); *H01L 25/16* (2013.01); *H01L 25/50* (2013.01); *H01L 24/13* (2013.01); *H01L 24/16* (2013.01); *H01L 24/81* (2013.01); *H01L 2224/13144* (2013.01); *H01L 2224/16225* (2013.01); *H01L 2924/15174* (2013.01); *H01L 2924/15311* (2013.01); *H01L 2924/19041* (2013.01); *H01L 2924/19105* (2013.01)

(58) Field of Classification Search
  USPC ........................................................ 257/737
  See application file for complete search history.

(56) References Cited

U.S. PATENT DOCUMENTS

| 7,046,501 | B2 | 5/2006 | Tsuji |
| 2005/0231889 | A1 | 10/2005 | Tsuji |
| 2007/0090511 | A1 | 4/2007 | Borland et al. |
| 2008/0266031 | A1 | 10/2008 | Uematsu et al. |
| 2009/0140400 | A1 | 6/2009 | Amey, Jr. et al. |
| 2010/0224960 | A1* | 9/2010 | Fischer ............... H01L 23/5223 257/532 |
| 2013/0228895 | A1 | 9/2013 | Iguchi |
| 2014/0022750 | A1 | 1/2014 | Moriya et al. |

FOREIGN PATENT DOCUMENTS

| JP | 2000323845 A | 11/2000 |
| JP | 2005-310814 A | 11/2005 |
| JP | 2007116177 A | 5/2007 |
| JP | 2008258312 A | 10/2008 |
| JP | 2009200470 A | 9/2009 |
| JP | 2012199533 A | 10/2012 |
| JP | 2014135502 A | 7/2014 |
| TW | 200836607 A | 9/2008 |

OTHER PUBLICATIONS

Written Opinion dated Apr. 18, 2017, by the International Searching Authority in counterpart International Application No. PCT/JP2017/002396 (PCT/ISA/237).

International Search Report dated Apr. 18, 2017, by the International Searching Authority in counterpart International Application No. PCT/JP2017/002396 (PCT/ISA/210).

* cited by examiner

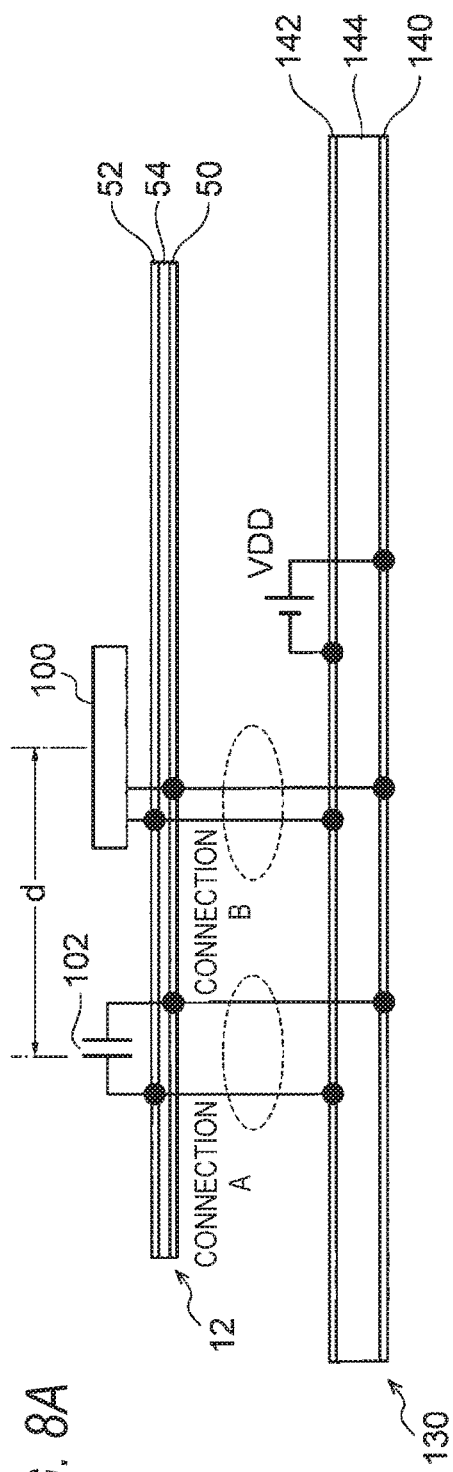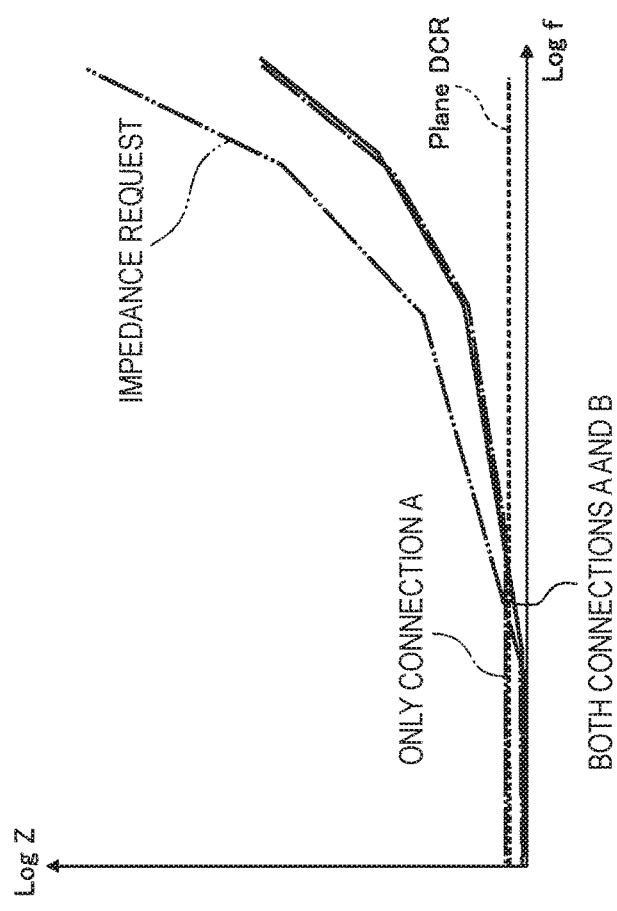
FIG. 8A
FIG. 8B

CIRCUIT SUBSTRATE AND METHOD FOR MANUFACTURING CIRCUIT SUBSTRATE

CROSS-REFERENCE TO RELATED APPLICATIONS

This Application is a Divisional of U.S. application Ser. No. 15/421,018, filed Jan. 31, 2017, which is based on and claims priority under USC 119 from Japanese Patent Application No. 2016-019170, filed on Feb. 3, 2016.

BACKGROUND

Technical Field

The present invention relates to a circuit substrate and a method for manufacturing the circuit substrate.

SUMMARY

According to an aspect of the invention, there is provided a circuit substrate including: a base material; and a capacitor layer including a first metal layer that is provided on the base material, a dielectric layer that is provided on the first metal layer, and a second metal layer that is provided on the dielectric layer. The first metal layer includes a first electrode region which is provided on the base material and is exposed from the dielectric layer and to which a first terminal of a capacitor element for supplying current to a circuit part through the capacitor layer is connected. The second metal layer includes a second electrode region in which the second metal layer is exposed and to which a second terminal of the capacitor element is connected.

BRIEF DESCRIPTION OF DRAWINGS

Exemplary embodiment(s) of the present invention will be described in detail based on the following figures, wherein:

FIG. 8A is a schematic diagram for illustrating a wiring impedance of the circuit substrate according to the exemplary embodiment and FIG. 8B is a graph illustrating the wiring impedance;

DETAILED DESCRIPTION

Hereinafter, exemplary embodiment of the present invention will be described in detail.

First Exemplary Embodiment

A circuit substrate and a method for manufacturing the circuit substrate according to the present exemplary embodiment will be described with reference to FIGS. 1A to 8B. The circuit substrate in the present exemplary embodiment mounts is a substrate for mounting an element mounting the element on a printed substrate such a mother board by mounting the semiconductor element such as a large scale integrated (LSI) circuit on one surface of the circuit substrate, disposing a connection member such as a bump on the other surface. As an example of the substrate, a semiconductor package substrate which is used in the semiconductor package for mounting a semiconductor integrated circuit is included.

Figure 1A:
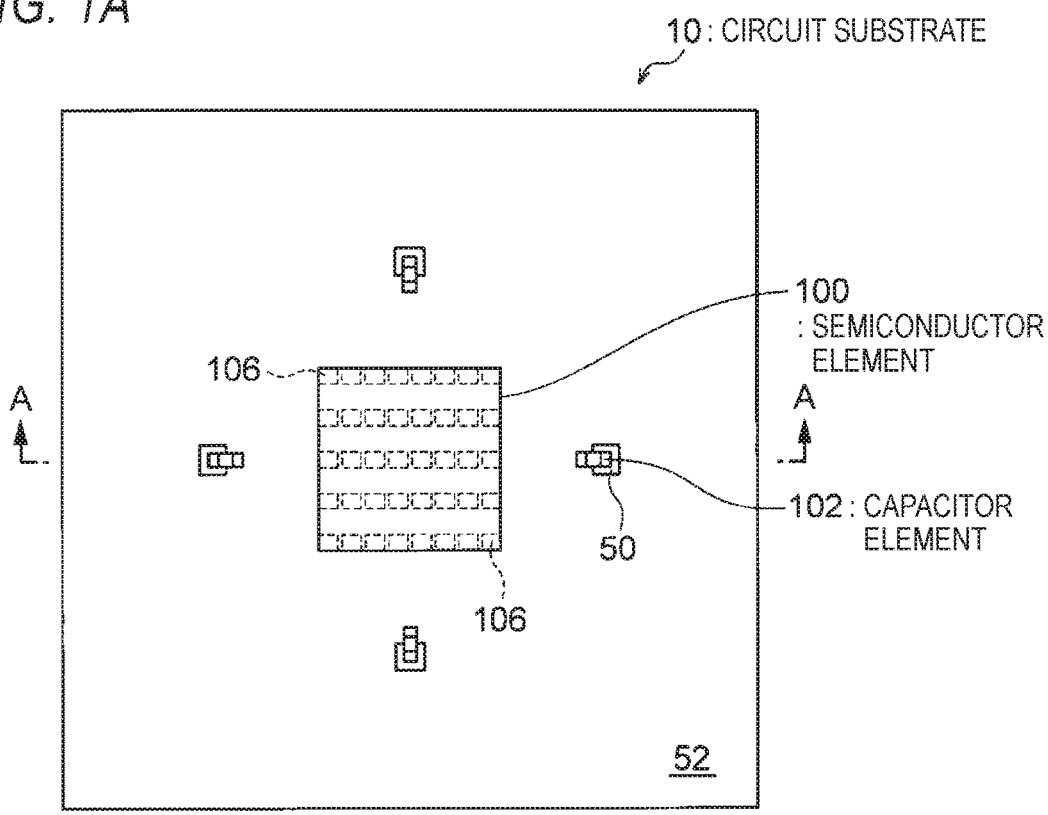
FIG. 1A is a plan view illustrating an example of a configuration of a circuit substrate according to a first exemplary embodiment.
Figure 1B:
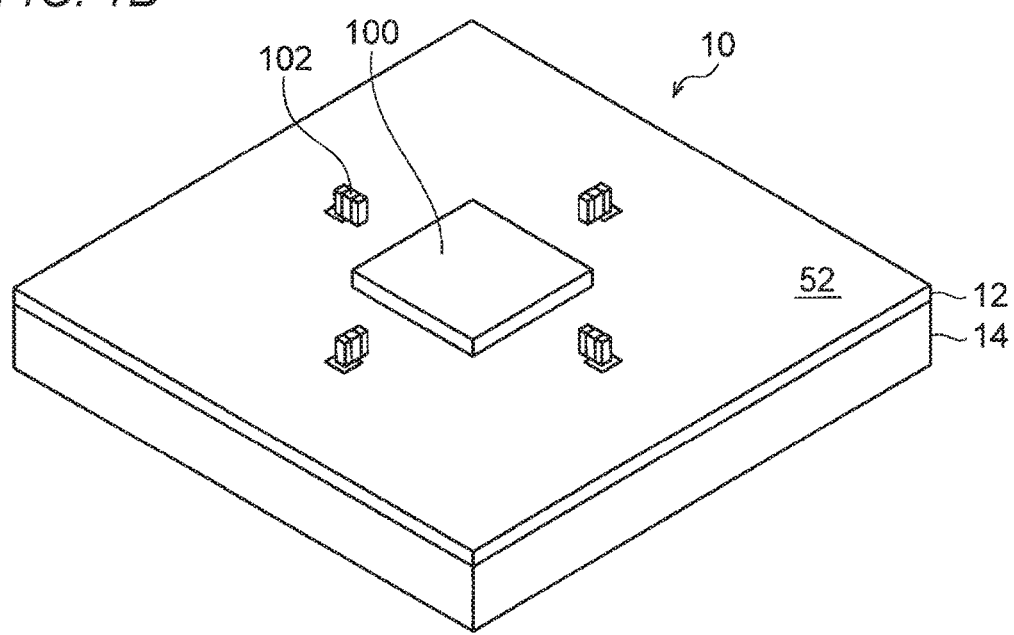
FIG. 1B is a perspective view.
Figure 2:
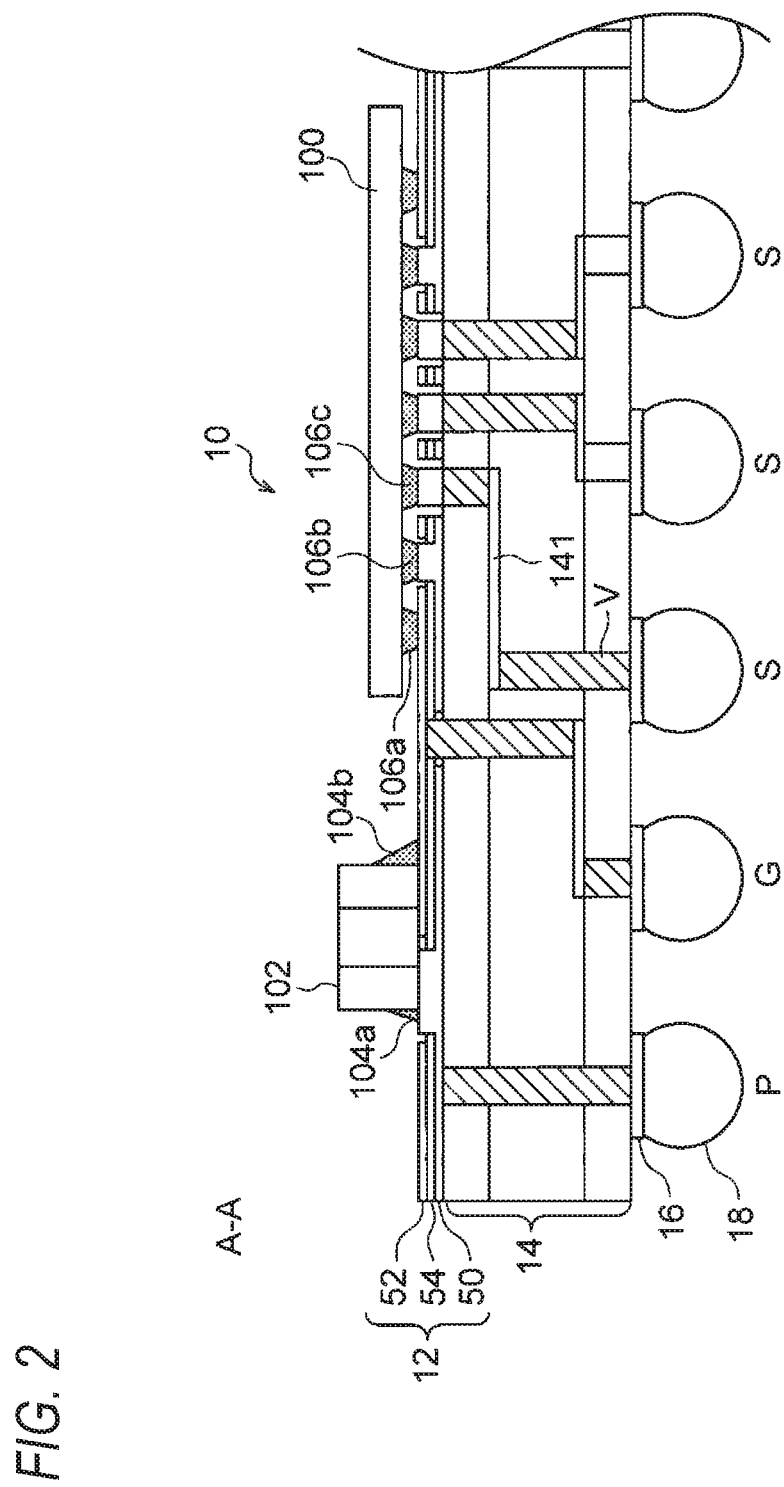
FIG. 2 is a longitudinal sectional view of the circuit substrate taken along A-A of FIG. 1A.

FIG. 1A illustrates a plane view of a circuit substrate 10 according to the present exemplary embodiment, FIG. 1B illustrates a perspective view of the circuit substrate 10, and FIG. 2 illustrates a sectional view of the circuit substrate 10 taken along A-A of FIG. 1A.

As illustrated in FIGS. 1A and 1B, one surface of the circuit substrate 10 includes a semiconductor element mounting region and a capacitor element mounting region as an example, in which a semiconductor element 100 and a capacitor element 102 are mounted on the surface.

In the present exemplary embodiment, the capacitor element 102 is a capacitor which is provided for supplying a transient current (for example, an alternating flowing when current the circuit in the semiconductor element 100 is switched) to the semiconductor element 100. For example, a low equivalent series inductance (ESL) type multi-layer ceramic capacitor (MLCC) or the like is used. The capacitor element 102 includes a first terminal and a second terminal which serve as the terminal at the positive side and the terminal at the negative side, the number of the first terminal and the second terminal may be one or plural. For example, it may have the plural terminals such as three terminals, four terminals, and eight terminals. The element (circuit part) to be mounted is not limited to the semiconductor element and the capacitor element, and the other elements such as an inductance element or a resistance element are mounted in some cases.

As illustrated in FIG. 2, the circuit substrate 10 is configured of a substrate having a multi-layer structure including a substrate 14 and a capacitor layer 12 which is provided on the substrate 14.

As illustrated in FIG. 2, the capacitor layer 12 is configured by including a first metal layer 50, a dielectric layer 54, and a second metal layer 52. A portion in which the first metal layer 50, the dielectric layer 54, and the second metal layer 52 are overlapped to each other in a lamination direction (a vertical direction in a front view of FIG. 2, and hereinafter, the direction is referred to as a "thickness direction") configures a capacitor (capacitance). In the present exemplary embodiment, the first metal layer 50 is set as the power supply potential layer (the power supply terminal of each element to be mounted on the circuit substrate 10 is connected) and the second metal layer 52 is set as the standard potential layer (the standard potential terminal of each element to be mounted on the circuit substrate 10 is connected). On the other hand, the first metal layer 50 serves as the power supply potential layer and the second metal layer 52 serves as the standard potential layer. However, it is not limited thereto, the first metal layer 50 may be set as the standard potential layer and the second metal layer 52 may be set as the power supply potential layer. Hereinafter, an example of a case where the "standard potential" is set as the ground will be described.

In the present exemplary embodiment, as metal configuring the first metal layer 50 and the second metal layer 52, copper (Cu) is used. However, it is not limited thereto, the other general wiring metal such as gold (Au) or aluminum (Al) may be used. In addition, in the present exemplary embodiment, as a dielectric material configuring the dielectric layer 54, strontium titanate (STO: SrTiO3). The STO is a preferred material as a dielectric material configuring the capacitor in which relative permittivity of the STO is about 300. In addition, a ferroelectric material such as barium titanate (BaTiO3) may be used. However, the dielectric material configuring the capacitor layer 12 is not limited thereto and the dielectric material which serves as the capacitor layer may be used. As an example thereof, the material having the relative permittivity higher than that of the material forming an interlayer insulating layer of the substrate can be used.

The substrate 14 is a multi-layer wiring substrate using a glass epoxy substrate, for example, and includes a pad 16 in a side facing the surface in which the capacitor layer 12 is provided and a solder bump (solder ball) 18 which is formed on the pad 16. The solder bump 18 is a projecting connection member for mounting the circuit substrate 10 on the other substrate (not illustrated) such as a mother board and in the circuit substrate 10 which is illustrated in FIG. 2, the solder bump 18 for a power supply P, the solder bump 18 for a ground G, and the solder bump 18 for a signal S are included.

The solder bump 18 is connected to a first metal layer (power supply potential layer) 50 and a second metal layer (ground layer) 52 of the capacitor layer 12 or to a signal terminal of the semiconductor element 100 through a via V and a wiring layer 141 of the pad 16 and the substrate 14. On the other hand, the semiconductor element 100 is connected to the capacitor layer 12 by a bump 106 (106a, 106b, and 106c are examples of the detailed connection) that is a projecting connection member which is configured by a material such as Au and the capacitor element 102 is connected to the capacitor layer 12 by a solder 104 (104a and 104b). The solder 104 is an example of the connection member for connecting the terminal of the capacitor element 102 and the capacitor layer 12 by melting.

The connection between the semiconductor element 100 and the capacitor element 102 and the capacitor layer 12 will be described with reference to FIG. 2. In FIG. 2, an example in which a ground terminal of the semiconductor element 100 is connected to the second metal layer 52 (ground layer) of the capacitor layer 12 by the bump 106a of the semiconductor element 100, the power supply terminal of the semiconductor element 100 is connected to the first metal layer 50 (power supply potential layer) by the bump 106b, and the signal terminal of the semiconductor element 100 is connected to the solder bump 18 (S) by the bump 106c through the inner layer wiring (wiring layer 141 and via V) of the substrate 14 is illustrated. On the other hand, regarding the capacitor element 102, an example in which one terminal is connected to the first metal layer 50 (power supply potential layer) by the solder 104a and the other terminal is connected to the second metal layer 52 (ground layer) by the solder 104b is illustrated. In addition, the second metal layer 52 is formed as one metal layer which is continued so as to cover the region on which the bump 106b and the bump 106c are mounted or the region on which one terminal of the capacitor element 102 is mounted. In a case where the semiconductor element 100 is a semiconductor integrated circuit such as a LSI, the ground terminal, the power supply terminal and the signal terminal are provided in plural. With respect to this, the plural bumps 106a, the plural bumps 106b, and the plural bumps 106c are provided.

In the circuit substrate 10 having the above configuration, the capacitor layer 12 is configured in a plane shaped so as to cover the semiconductor element 100 or the capacitor element 102. Accordingly, the capacitor layer 12 is formed of a supply source for supplying the transient current to the semiconductor element 100 and also includes a function as a track of the low impedance for supplying the transient current from the capacitor element 102 to the semiconductor element 100. That is, in a comparison of the configuration for supplying the transient current through a simple wiring, the configuration in which the current is supplied in the low impedance from the capacitor element 102. In addition, as illustrated in FIGS. 1A and 1B, a region of the front surface other then the mounting region of the element (in the example of FIGS. 1A and 1B, the semiconductor element 100 and the capacitor element 102) becomes the second metal layer 52 that is a ground layer. That is, the front surface of the circuit substrate 10 is covered with the ground layer, for example, it has a configuration in which an influence of the electromagnetic noise from the outside of the circuit substrate 10 is suppressed and the configuration in which the electromagnetic noise generated inside the circuit substrate 10 hardly leaks to the outside.

Next, a configuration of the capacitor layer 12 according to the present exemplary embodiment will be described in detail with reference to FIG. 3. The circuit substrate 10 according to the present exemplary embodiment includes the capacitor layer 12 on which the element is mounted on one surface. The configuration of the capacitor layer 12 includes various variations as described below in detail, and is selected depending on the types of the element to be mounted and the mounting method.

Figure 3:
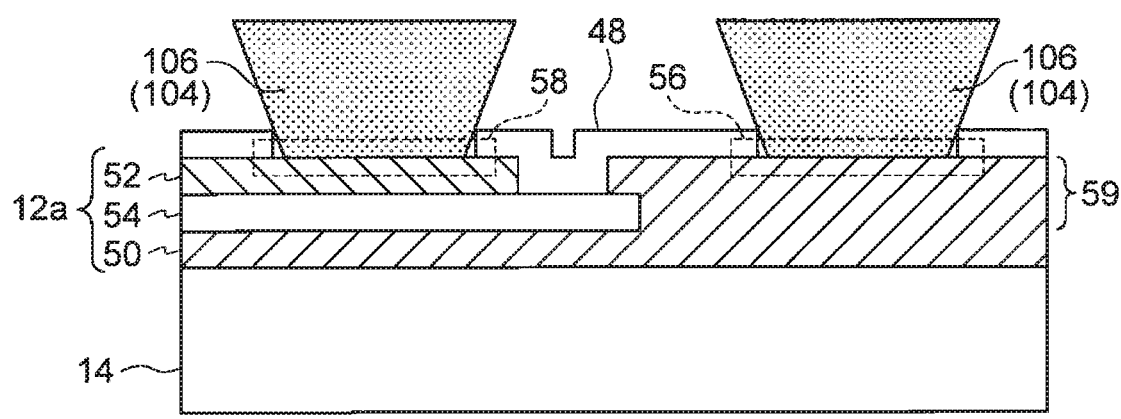
FIG. 3 is a schematic diagram for illustrating a capacitor layer according to the first exemplary embodiment.

As illustrated in FIG. 3, a capacitor layer 12a according to the present exemplary embodiment is configured by the first metal layer 50, the dielectric layer 54, and the second metal layer 52 which are laminated on the substrate 14 in this order.

As illustrated in FIG. 3, the first metal layer 50 includes a projection portion 59 and the projection portion 59 includes the first electrode region 56 which is exposed to the front surface of the circuit substrate 10 that is an element mounting region for mounting the element such as the semiconductor element 100 and the capacitor element 102. The second metal layer 52 does not include a projected portion such as the projection portion 59 and includes a second electrode region 58 which is exposed to the front surface of the circuit substrate 10. That is, in the second metal layer 52, the second metal layer 52 itself includes the second electrode region 58. The first electrode region 56 and the second electrode region 58 are distinguished from the first metal layer 50 and the second metal layer 52 in a point that the first electrode region 56 and the second electrode region 58 do not include a solder resist 48 to be formed on other than the element mounting region, for example. However, it is not necessary include the solder resist 48. A space on which each of the plural bumps 106 which are provided on the circuit substrate 10 can be mounted may be secured as the first electrode region 56 and the second electrode region 58.

In the capacitor layer 12a according to the present exemplary embodiment, the first electrode region 56 is projected from the front surface (upper surface) of the first metal layer 50. In other words, the present exemplary embodiment is an aspect in which the first electrode region 56 is formed on the first metal layer 50. The front surface of the first electrode region 56 is exposed to the front surface of the circuit substrate 10 at the substantially same height as that of the front surface of the second electrode region 58. As illustrated in FIG. 3, the bump 106 of the semiconductor element 100 or the solder 104 of the capacitor element 102 is connected to each of the first electrode region 56 and the second electrode region 58.

Next, a method for manufacturing the circuit substrate 10 including the method for manufacturing the capacitor layer 12a will be described with reference to FIGS. 4A to 7C. As described above, the circuit substrate 10 according to the present exemplary embodiment is largely divided into the capacitor layer 12a and the substrate 14.

Figure 4A:
FIGS. 4A to 4D illustrate a part of the longitudinal sectional view illustrating an example of a method for manufacturing a circuit substrate according to the first exemplary embodiment.

Firstly, the method for manufacturing the capacitor layer 12a will be described. Firstly, as illustrated in FIG. 4A, a dielectric film 32 is formed on a base material 30. The "substrate" here refers to a member serving as a base for configuring a layer structure. As the base material 30, aluminum foil (Al foil) is used, for example. However, the other metal foil such as cupper foil or nickel foil may be used. In addition, as the dielectric film 32, a STO film is used as an example. In the STO film, dry etching method such as a chemical vapor deposition (CVD) method or a physical vapor deposition (PVD) method can be used. Specifically, the film is formed to a thickness of about several hundred nm to several μm by a vapor deposition method such as a plasma CVD method, an aerosol CVD method, a sputtering method, an ion plating method, and an evaporation method. As an example, the STO film is formed to a thickness of about 500 nm. When the dielectric film 32 is formed by the vapor deposition method in this manner, since the dielectric film 32 can be formed with an extremely thin thickness, the capacitance of the capacitor is increased even with the same area. The base material 30 may be metal other than Al as long as the base material 30 is a material which can form a dielectric film such as a STO film, and may be necessarily have a foil shape. Furthermore, the base material 30 may be the other materials other than metal materials. In addition, as a method for forming the dielectric film such as the STO film, the other forming method such as a solution method for applying the solution without vapor deposition or attaching the film-shaped dielectric film in which the thickness is increased can be performed.

Figure 4B:

Next, as illustrated in FIG. 4B, the dielectric film 32 is patterned into a predetermined shape by photolithography and etching. As the etching, dry etching, wet etching, and the like are used without particular limitation. In addition, the dielectric film may be patterned by another forming method such as a mask evaporation or a lift-off without using etching.

Figure 4C:
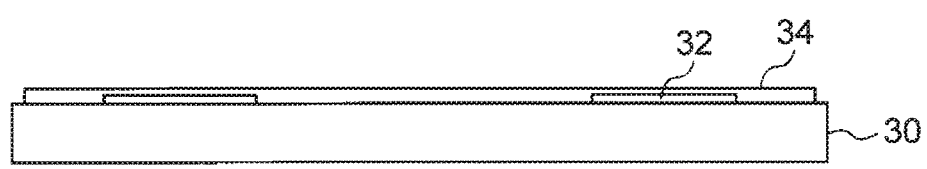

Next, as illustrated in FIG. 4C, a metal film 34 is formed. As the material of the metal film 34, Cu, Au, Al, or the like is used without particular limitation. In the present exemplary embodiment, Cu is used. The metal film 34 is formed to a thickness of about 1 μm to 20 μm for example, by dry etching such as the CVD method or the PVD method. Here, in a region a dielectric film 72 is removed after patterning in the step of FIG. 4B, the metal films 34 are directly laminated on the base material 30 so as to bury between the dielectric films 32, and in the region in which the dielectric film 32 is remained, the metal films 34 are laminated on the dielectric film 32. As a result, the position at the lower surface side of the dielectric film 32 is identical to the position at the lower surface side of the region embedding between the dielectric films 72 among the metal film 34 in the front surface position of a base material 70.

Figure 4D:
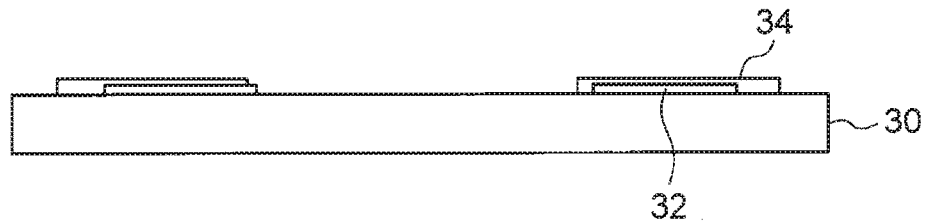

Next, as illustrated in FIG. 4D, the metal film 34 is patterned into a predetermined shape by photolithography and etching. As the etching, dry etching, wet etching, and the like are used without particular limitation. In addition, the metal film 34 may be patterned by another forming method such as a mask evaporation or a lift-off without using etching. By the above steps, the dielectric film 32 and the metal film 34 are maintained on the base material 30 in a state where each of the dielectric film 32 and the metal film 34 is patterned.

On the other hand, the manufacturing of the substrate 14 is performed by the following method.

Figure 5A:
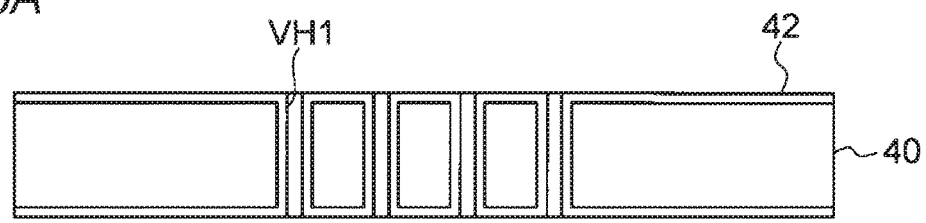
FIGS. 5A to 5D illustrate a part of the longitudinal sectional view illustrating the example of the method for manufacturing a circuit substrate according to the first exemplary embodiment.

That in addition, as illustrated in FIG. 5A, firstly, after forming a via hole VH1 on a base material 40, a metal film 42 is formed. As the base material 40, for example, a glass epoxy resin is used. In addition, the metal film 42 is formed by plating Cu, for example.

Figure 5B:
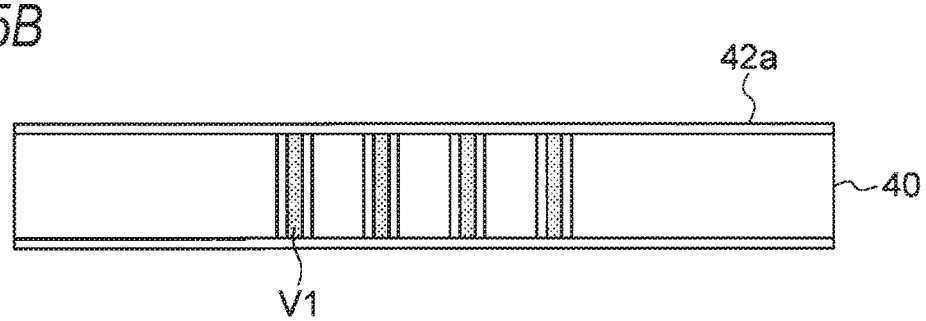

Next, as illustrated in FIG. 5B, a via V1 is formed by embedding the via hole VH1 with metal and plating for covering entire the base material 40 with a metal film 42a is performed. As the material of the metal film 42a, Cu is used, for example. In addition to the plating of the previous step, the plating is performed using a dry plating method or an electrolytic plating method, for example.

Figure 5C:
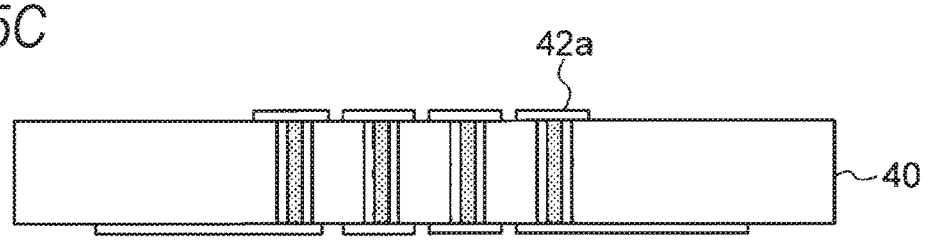

Next, as illustrated in FIG. 5C, the metal film 42a is patterned into a predetermined shape by photolithography and etching. In addition, the patterning of the metal film 42a may be performed by the other forming method such as a mask vapor deposition and the lift-off without using etching.

Figure 5D:
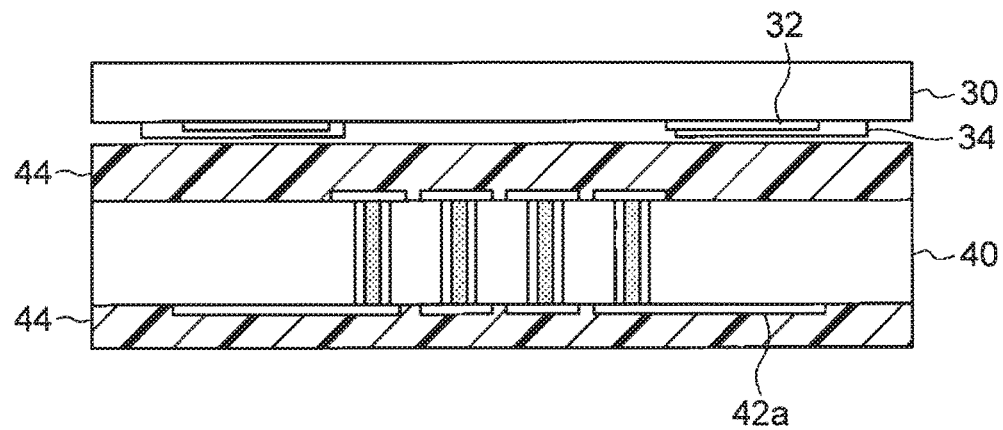

Next, as illustrated in FIG. 5D, after attaching an interlayer insulating film 44 to both sides of the base material 40 on which the metal film 42a is formed, the base material 30 illustrated in FIG. 4D is aligned on the base material 40. As the interlayer insulating film 44, a film shaped interlayer insulating film to be used in a general build-up substrate can be used and attaching is performed by laminating. The interlayer insulating film 44 is a thermosetting resin. Before applying the predetermined heat, in a case where the base material 30 on which the dielectric film 32 and the metal film 34 are formed is attached, the interlayer insulating film 44 has flexibility to extent that at least one of the dielectric film 32 and the metal film 34 is embedded in the interlayer insulating film 44.

As a method different from that of the present exemplary embodiment, a method for directly forming the dielectric film 32 on the base material 40 by the vapor deposition method without using the base material 30 such as Al foil or the like can be also considered. If the method can be adopted, the dielectric film having a thin thickness can be directly formed on the base material 40. However, in a case where the dielectric material for a capacitor of the STO film or the like is formed by the vapor deposition, a process is generally required under the room temperature, and the base material 40 which is configured of a resin material (glass epoxy resin or the like) to be used in the general circuit substrate cannot be able to withstand the process temperature at that time. Accordingly, it is difficult to form the dielectric film 32 on the base material 40 that is a general material of the circuit substrate, directly.

In the present embodiment, the dielectric film is formed on Al that is the metal material once. Thereafter, the dielectric film is displaced to the base material 40 side as described below. That is, as an example of the present exemplary embodiment, as the base material 30, a material having a heat resistance temperature higher than the heat resistance temperature of the interlayer insulating film 44 or the base material 40 is selected. Since the dielectric film 32 can be formed on the base material 30 with high heat resistant by the selection, the dielectric film 32 can be formed on the interlayer insulating film 44 or the base material 40, even though the dielectric film 32 is required to be formed at a temperature higher than the heat resistance temperature of the interlayer insulating film 44 or the base material 40. The "heat resistance temperature" here refers to the maximum temperature at which the properties of the material can be maintained without being changed in a state where an external force is not applied.

Figure 6A:
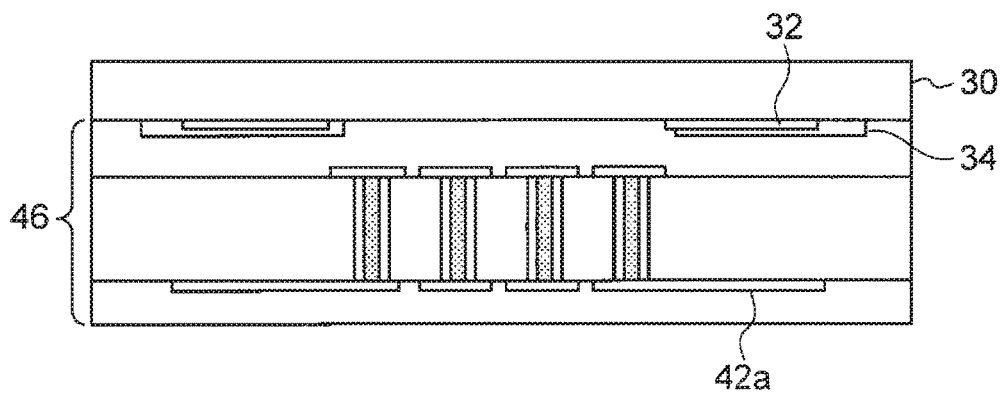
FIGS. 6A to 6C illustrate a part of the longitudinal sectional view illustrating the example of the method for manufacturing a circuit substrate according to the first exemplary embodiment.

Next, as illustrated in FIG. 6A, by heating the structure including the base material 30 and the base material 40 illustrated in FIG. 5D, the interlayer insulating film 44 is thermally cured. Through this step, a core substrate 46 of the substrate 14 according to the present exemplary embodiment is formed, the metal film 34 on the base material 30 and the dielectric film 32 are displaced to the core substrate 46, and at least a part of the metal film 34 and the dielectric film 32 is embedded.

Figure 6B:
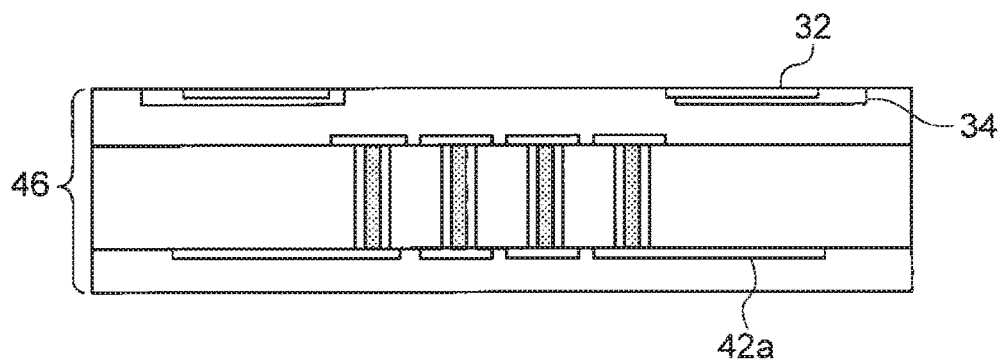

Next, as illustrated in FIG. 6B, the base material 30 is removed. In the present exemplary embodiment, as an example, the base material 30 as Al foil is dissolved with a sodium hydroxide solution and is removed. Specifically, the base material 30 is immersed in the sodium hydroxide solution in a state of FIG. 6A and the base material 30 is removed by completely dissolving the Al foil by a chemical reaction. The Al foil may be mechanically removed by grinding or the like. However, when the Al foil is removed with a solution, mechanical stress on the base material is reduced compared to a case where the Al foil is mechanically removed. In this manner, as the material of the base material 30, the metal can be used in a viewpoint of a function as a supporting base material for forming the dielectric film and easy removal by a solution. Furthermore, regarding the thickness, a foil form can be used from the viewpoint of the easy removal by the solution. In addition, from the viewpoint of availability as a general metal, Al can be used as in the present exemplary embodiment. The "foil form" here refers to a material having a thickness of 300 μm or less.

Figure 6C:
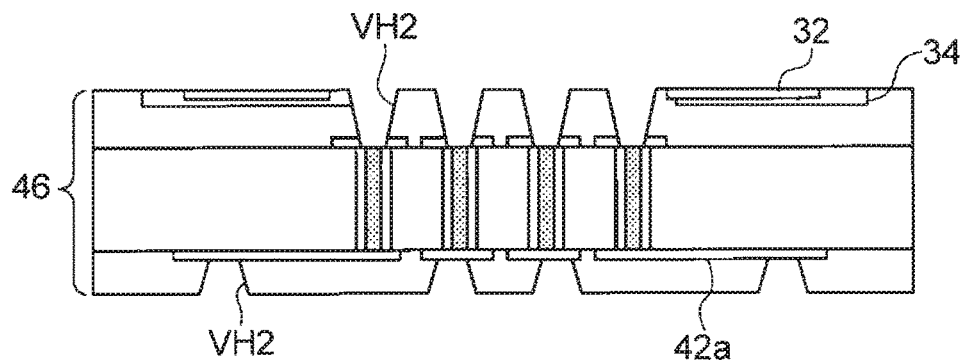

Next, as illustrated in FIG. 6C, a via hole VH2 with a bottom that reaches the base material 40 is formed at a predetermined location of both surfaces of the core substrate 46. The forming of the via hole VH2 is performed by a laser device, for example. The forming of the via hole VH2 according to the present exemplary embodiment is not limited to the laser device and may be performed using a drill.

Next, a thin Cu film (seed layer) is formed on entire the core substrate 46 including inner portion of the via hole VH2 by the dry etching method (not illustrated). The seed layer here refers a layer to be a conductor when subjecting a plating process in the post-step. Thereafter, a via V2 is formed by embedding the via hole VH2 by the electrolytic plating and a metal film 42b for covering entire the core substrate 46 is formed. That is, forming of the metal film 42b and embedding of the via hole VH2 are performed in the same step at the same time. As the material of the metal film 42b, Cu is used, for example. Among the metal films 34, the metal film 42b and the metal film 34 are connected to each other in a location (a location exposed from the dielectric film 32) which is exposed to the front surface of the core substrate 46 when the metal film 42b is formed. In addition, through this step, the metal film 34 and the metal film 42b are connected to each other through the via V2 as an example of a conductive portion which passes through the metal film 34 and the dielectric film 32 and does not have the interface.

Figure 7A:
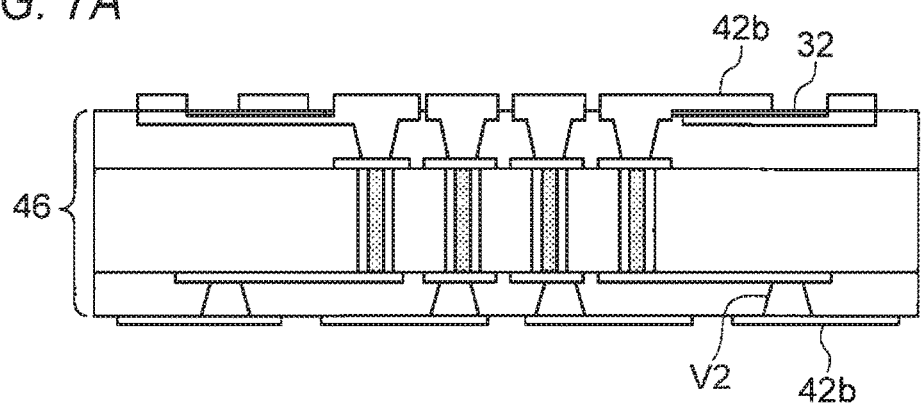
FIGS. 7A to 7C illustrate a part of the longitudinal sectional view illustrating the example of the method for manufacturing a circuit substrate according to the first exemplary embodiment.

Thereafter, as illustrated in FIG. 7A, the metal film 42b is patterned into a predetermined shape by photolithography and etching. That is, in the core substrate 46 which is in a state where the metal film 42b is connected to the metal film 34, the metal film 42b is electrically separated into a pattern for a power supply potential, a pattern for a standard potential, and a pattern for a signal, respectively. Accordingly, each of the pattern for a power supply potential, the pattern for a standard potential, and a pattern for a signal is formed in a state where each of patterns is exposed at the same height. The "same height" here does not mean the completely same height. For example, the term "same height" includes a range in which as a result of manufacturing such that the patterns formed at the same height, the heights are shifted due to variations or the like.

Figure 7B:
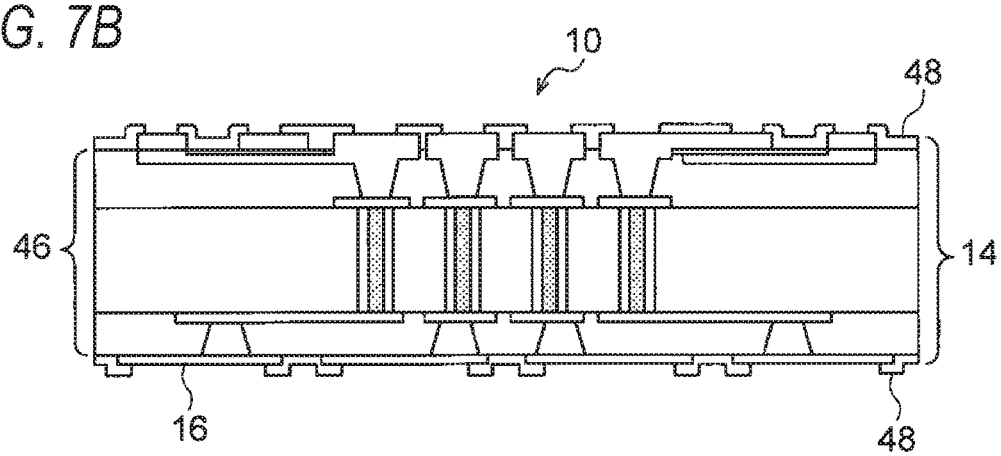

Next, as illustrated in FIG. 7B, an opening is provided at a predetermined location (a location of the first electrode region which is connected to the terminal of the element, the second electrode region, or the like) by photolithography and the solder resist 48 serving as a resist film (insulating film) is formed. Through this step, the element mounting region including the pad 16 or the like is formed. The solder resist 48 is not necessarily required to be provided and a configuration in which the solder resist 48 is not formed may be used. Through the above manufacturing steps, the circuit substrate 10 according to the present exemplary embodiment is manufactured.

The circuit substrate 10 manufactured by the above steps has a structure in which the metal film 42b serves as the standard potential layer and a part of the region of the metal film 42b includes the electrode region for a standard potential. In addition, a part of the other region of the metal film 42b is connected to the metal film 34 which serves as the power supply potential by the metal film 42b itself, and serves as the electrode region for a power supply potential which is electrically connected to the metal film 34.

Figure 7C:
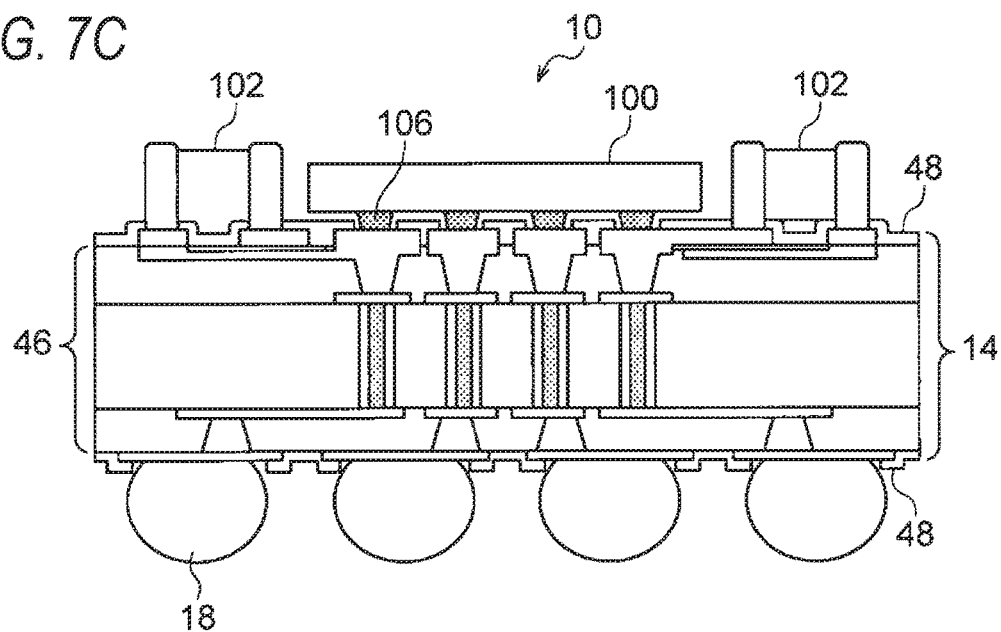

Next, as illustrated in FIG. 7C, a required element such as the semiconductor element 100 or the capacitor element 102 is mounted on one surface of the circuit substrate 10 (on the capacitor layer 12) and the solder bump 18 is formed on the pad 16 of the other surface of the circuit substrate 10. In addition, the front surface side of the circuit substrate 10 is molded with a resin as needed (not illustrated). Through the above steps, the circuit substrate 10 according to the present exemplary embodiment and the semiconductor package using the circuit substrate 10 are manufactured.

Next, the connection (in FIG. 2, the connection from the solder bump 18 to the semiconductor element 100, the capacitor element 102, or the capacitor layer 12 through a via V and a wiring layer 141 (hereinafter, this connection will be referred to as a "longitudinal connection")) of the circuit substrate 10 in a thickness direction will be described with reference to FIGS. 8A and 8B.

FIG. 8A is a schematic diagram illustrating the longitudinal connection for connecting a printed substrate 130 of the mother board which mounts the circuit substrate 10 (semiconductor package) and the capacitor layer 12 in the circuit substrate 10 through the solder bump 18. The printed substrate 130 includes a power supply potential layer 140, a ground layer 142, and an interlayer insulating layer 144 which is interposed between the power supply potential layer 140 and the ground layer 142. On the other hand, the capacitor layer 12 includes a first metal layer (power supply potential layer) 50, a second metal layer (ground layer) 52 (hereinafter, both of the first metal layer and the second metal layer are collectively referred to as the "metal layer" in some cases) and the dielectric layer 54 which is interposed between the first metal layer 50 and the second metal layer 52.

Next, as illustrated in FIG. 8A, a power supply VDD is connected between the power supply potential layer 140 and the ground layer 142 of the printed substrate 130 and the semiconductor element 100 and the capacitor element 102 are connected between the first metal layer 50 and the second metal layer 52 of the capacitor layer 12. The power supply potential layer 140 of the printed substrate 130 and the first metal layer 50 of the capacitor layer 12 are connected through a longitudinal connection and the ground layer 142 of the printed substrate 130 and the second metal layer 52 of the capacitor layer 12 are connected through the longitudinal connection.

Next, as illustrated in FIG. 8A, among these longitudinal connections, a longitudinal connection vicinity of the capacitor element 102 is referred to as a connection A and a longitudinal connection vicinity of the semiconductor element 100 is referred to as a connection B. A set of the connections between each of power supplies of the connection A and the connection B and the ground connectively corresponds to a set of the connection by the solder bump 18 which is indicated by a symbol "P" in FIG. 2 and a connection of the solder bump 18 which is indicated by a symbol "G". That is, the "longitudinal connection" according to the preset exemplary embodiment, specifically includes the via V (conductive portion) and the wiring layer 141.

Here, in the capacitor layer 12 according to the present exemplary embodiment, the metal layer is formed into a thin film having a thickness of about 1 μm to 20 μm for example, by the vapor deposition. Accordingly, the sheet resistance of the metal layer with respect to a direct current (direct current sheet resistance) is easily increased.

Here, it is desired that an impedance between the power supply and the ground terminal of the semiconductor element 100 (hereinafter, the impedance will be referred to as an "impedance Zpg") becomes small as possible in the required frequency band. The impedance Zpg is an impedance expecting the outside from the power supply terminal of the semiconductor element 100, in which the impedance returns from the power supply terminal of the semiconductor element 100 to the ground terminal of the semiconductor element 100 through the first metal layer 50, the power supply potential layer 140, a positive electrode of a power supply VDD, a negative electrode of the power supply VDD, the ground layer 142, and the second metal layer 52. The impedance Zpg, the resistance of the metal layer, and the relationship between the connection A and the connection B will be described with reference to FIG. 8B. FIG. 8B is a graph illustrating the impedance of each portion by defining a horizontal axis as a frequency (Log f) and defining a vertical axis as an impedance (Log Z).

Next, as illustrated in FIG. 8A, when a distance between the semiconductor element 100 and the capacitor element 102 is defined as d, a direct current resistance according to the distance d is generated between the semiconductor element 100 and the capacitor element 102 due to the sheet resistance of the metal layer. In FIG. 8B, this resistance is expressed as a "plane DCR". The plane DCR indicates a constant value regardless of the frequency. On the other hand, a target characteristic of the impedance Zpg is illustrated as an "impedance request".

Firstly, in a case where the circuit substrate 10 includes only the connection A and does not include the connection B, the impedance Zpg indicates the characteristic which is expressed as the "only connection A" in FIG. 8B. That is, the impedance request is not satisfied in the low frequency range. The reason why the impedance request is not satisfied in the low frequency range is that although there are many semiconductor elements 100 such as the LSI to be mounted on the circuit substrate 10 require a large current, it is necessary to supply the large current through a thin metal layer from the position of the connection A. With respect to this, in a case where there are both the connection A and the connection B, the impedance Zpg generates the characteristic which is expressed as the "both connections A and B" in FIG. 8B. That is, the impedance characteristic in the low frequency region satisfies the impedance request. The reason why the impedance characteristic in the low frequency region satisfies the impedance request is that the high frequency current mainly flows the capacitor element 102 and the capacitor layer 12 through the connection B, and the low frequency current mainly flows through the connection B.

On the other hand, in a case where the circuit substrate 10 includes only the connection B and does not include the connection A, it is necessary to flow the current for recharging the charge discharged by the capacitor element 102 to the capacitor element 102 through the metal layer having the distance d and the connection B. However, as described above, since the thickness of the metal layer having the distance d indicates a relatively high resistance, power loss and heat generation in the resistance is generated.

As described above, it is more preferable that both the connection A and the connection B are included in the circuit substrate 10 according to the present embodiment. However, since the connection A or the connection B may be provided depending on the distance d between the semiconductor element 100 and the capacitor element 102 and the characteristics of the impedance Zpg to be a target, an aspect that any of the connection A and the connection B is provided may be used.

Specifically, it is configured as follows. That is, both the connection A and the connection B connected to the vicinity of the electrode region to which the semiconductor element 100 is connected and the vicinity of the electrode region to which the capacitor element 102 is connected, respectively, among the metal layers which configure the capacitor layer 12. With this configuration, since the current amount flowing through the metal layer decreases, the influence of the resistance in the metal layer is reduced compare to a configuration that only one of the connection A and the connection B is connected to the vicinity of the electrode region. In the present exemplary embodiment, the "vicinity" of the electrode region to which the semiconductor element 100 is connected includes the electrode region itself, and refers to a region closer to the target electrode region than the distance that separates the distance between the target electrode region and the electrode region on which the capacitor element 102 is mounted into two equal parts. In addition, the "vicinity" of the electrode region to which the capacitor element 102 is connected refers to a region closer to the target electrode region than the region vicinity of the electrode region on which the semiconductor element 100 is mounted. As an example, the vicinity of the electrode region to which the semiconductor element 100 is connected may be a region which overlaps the semiconductor element 100 in a top surface view, and the vicinity of the electrode region to which the capacitor element 102 is connected may be a region which overlaps the capacitor element 102 in the top surface view.

In addition, each of the connection A and the connection B includes two longitudinal connections for connecting the power supply connection and the ground connection, and in both connection A and the connection B, total four longitudinal connections are included. In a case where the circuit substrate is viewed through one surface side, at least one longitudinal connection among the four longitudinal connection may be connected to the metal layer in a position which overlaps the electrode region which is provided on the metal layer configuring the capacitor layer 12. With this configuration, the current flowing the longitudinal connection which is connected in the overlapping position is supplied to the semiconductor element 100 and the capacitor element 102 without flowing the metal layer in a horizontal direction. Therefore, the influence of the resistance in the metal layer is reduced.

Furthermore, in a case where the circuit substrate is viewed through one surface side, all of the four longitudinal connections described above may be connected to the metal layer in a position which overlaps the electrode region which is provided on the metal layer configuring the capacitor layer 12. With this configuration, the current flowing the longitudinal connection which is connected in the overlapping position is supplied to the semiconductor element 100 and the capacitor element 102 without flowing the metal layer in a horizontal direction. Therefore, the influence of the resistance in the metal layer is reduced.

Second Exemplary Embodiment

A circuit substrate 10a according to the present exemplary embodiment and a method for manufacturing the circuit substrate 10a will be described with reference to FIGS. 9 to 11E. The present exemplary embodiment is an aspect that the capacitor layer 12 is separated from the substrate 14 in the circuit substrate 10 of the present exemplary embodiment.

Figure 9:
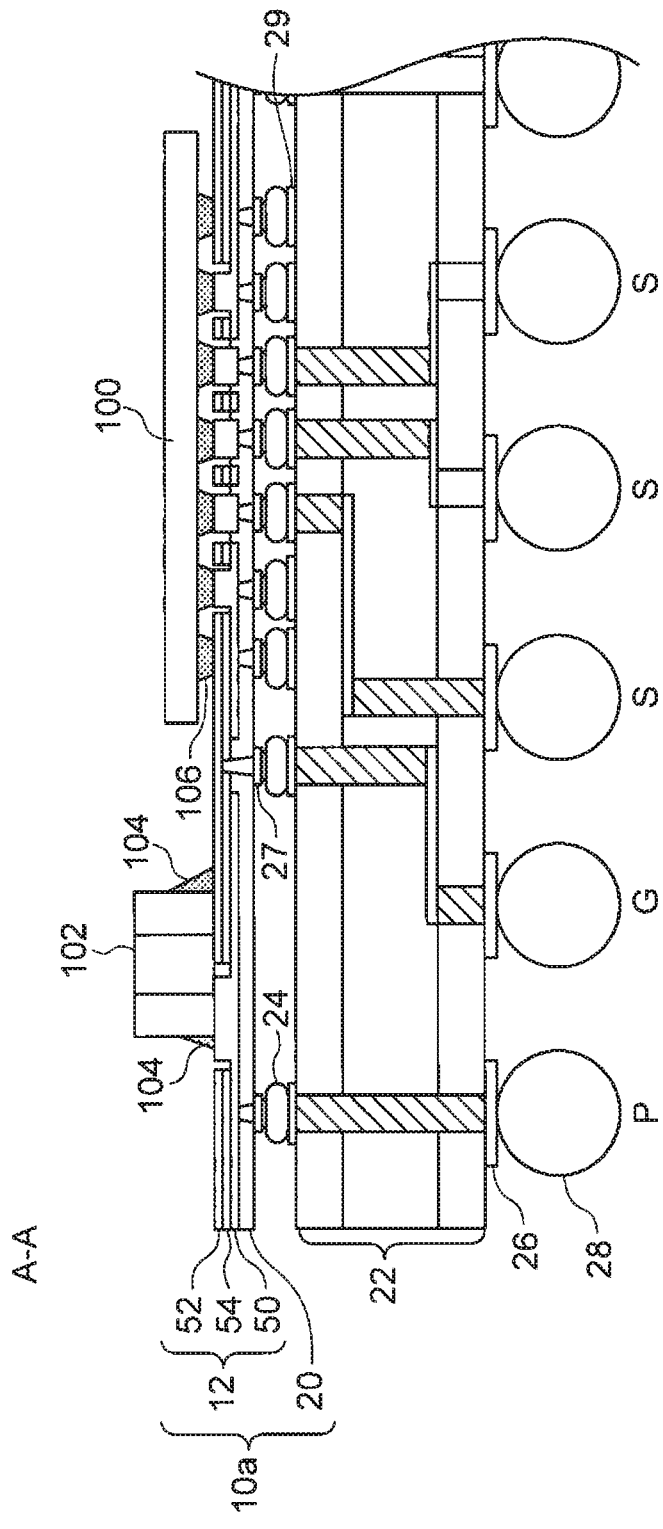
FIG. 9 is a longitudinal sectional view illustrating an example of a configuration of a circuit substrate according to a second exemplary embodiment.

Next, as illustrated in FIG. 9, the circuit substrate 10a is configured by including an interlayer insulating layer 20 which is provided under the capacitor layer 12 and the capacitor layer 12. The capacitor layer 12 is configured by including the first metal layer 50, the dielectric layer 54, and the second metal layer 52.

The semiconductor element 100 is connected to the front surface (element mounting surface and the front surface of the capacitor layer 12) side of the circuit substrate 10a through the bump 106, and the capacitor element 102 is connected thereto through the solder 104. In addition, plural pads 27 to which each semiconductor element 100, the capacitor element 102, or the capacitor layer 12 are connected through the conductive portion such as a VIA which is provided inside the circuit substrate 10a are provided at the back surface (front surface of the interlayer insulating layer 20) side of the circuit substrate 10a. In FIG. 9, the configuration of each layer of the first metal layer 50, the dielectric layer 54, and the second metal layer 52 of the circuit substrate 10a and the connection between the semiconductor element 100 and the capacitor element 102 illustrates the similar example as that of the capacitor layer 12 illustrated in FIG. 2.

In addition, a pitch (distance) of each electrode region of the circuit substrate 10a at the front surface side is the same as the pitch of plural pads 27 at the back surface side. As an example, in a case where the circuit substrate 10a is viewed through one surface side, the electrode region at the front surface side and the plural pads 27 at the back surface side have a positional relationship in which the electrode region overlaps the plural pads 27.

On the other hand, a substrate 22 is, for example, a multi-layer wiring substrate using a glass epoxy substrate. Plural pads 29 are provided at the front surface (mounting surface of the capacitor layer 12) side of the substrate 22, and plural pads 26 are provided at the back surface (surface facing the mounting surface of the capacitor layer 12) side of the substrate 22. The substrate 22 according to the present exemplary embodiment has a function of an interposer for changing (enlarging) the connection pitch by the pad 27 of the circuit substrate 10a to a connection pitch by the pad 26 of the substrate 22. In other words, in the configuration illustrated in FIG. 9, the circuit substrate 10a does not include the function for enlarging the connection pitch (pitch of the bump 106) of the semiconductor element 100. The pitch of the pad 27 of the back surface of the circuit substrate 10a is same as the pitch of the bump 106 of the semiconductor element 100.

The pad 29 is connected to the pad 27 of the circuit substrate 10a through a bump 24. Each of plural pads 26 includes a solder bump (solder ball) 28 which is formed on the pad 26. The solder bump 28 is a connection member for mounting the substrate 22 which mounts the circuit substrate 10a on the other substrate (not illustrated) such as a mother board and in the substrate 22 which is illustrated in FIG. 9, the solder bump 28 for a power supply P, the solder bump 28 for a ground G, and the solder bump 28 for a signal S are included. Regarding the connection between the wiring of the inner layer of the substrate 22 and the circuit substrate 10a (capacitor layer 12), an example which is the same as that of FIG. 2 is illustrated in FIG. 9. Accordingly, the connection between each bump 28 expressed by the symbols P, G and S and the semiconductor element 100, the capacitor element 102, and the capacitor layer 12 is the same as that of FIG. 2.

The configuration of the circuit substrate 10a (capacitor layer 12) is not particularly limited. In the present exemplary embodiment, the same configuration as that of FIG. 3 is adopted. However, a configuration of FIG. 12 or FIG. 16 to be described may be adopted.

A method for manufacturing the circuit substrate 10a will be described with reference to FIGS. 10A to 11E. The same method of the first exemplary embodiment can be used in many steps. However, an example thereof is as follows.

Figure 10A:
FIGS. 10A to 10E illustrate a part of the longitudinal sectional view illustrating an example of a method for manufacturing a circuit substrate according to the second exemplary embodiment.

Firstly, as illustrated in FIG. 10A, a dielectric film 62 is formed on a base material 60. As the base material 60, Al foil is used, for example. In addition, as the dielectric film 62, a STO film is used as an example. The STO film is formed in a thickness of above 500 nm by the CVD method, the PVD method, or the like, for example.

Figure 10B:
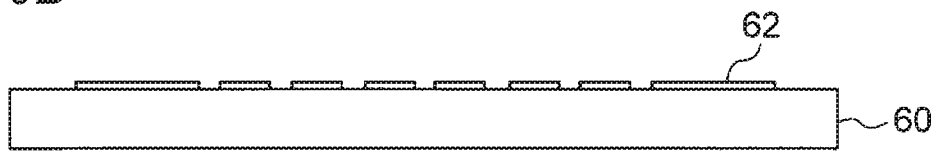

Next, as illustrated in FIG. 10B, the dielectric film 62 is patterned into a predetermined shape by photolithography and etching. As the etching, dry etching, wet etching, and the like are used without particular limitation.

Figure 10C:
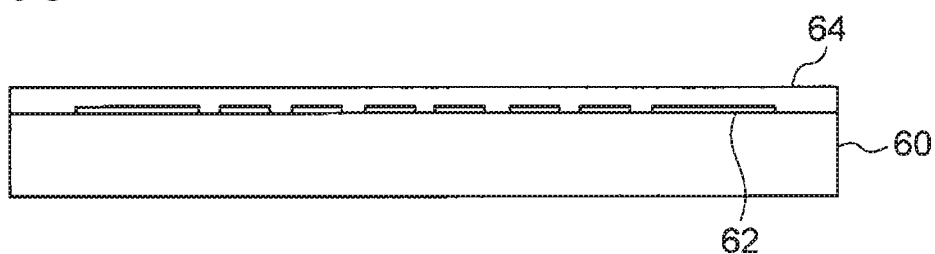

Next, as illustrated in FIG. 10C, a metal film 64 is formed. As the material of the metal film 64, Cu, Au, Al, or the like is used without particular limitation. In the present exemplary embodiment, Cu is used. The metal film 64 is formed to a thickness of about 1 μm to 20 μm by dry etching such as the sputtering method or the evaporation method.

Figure 10D:
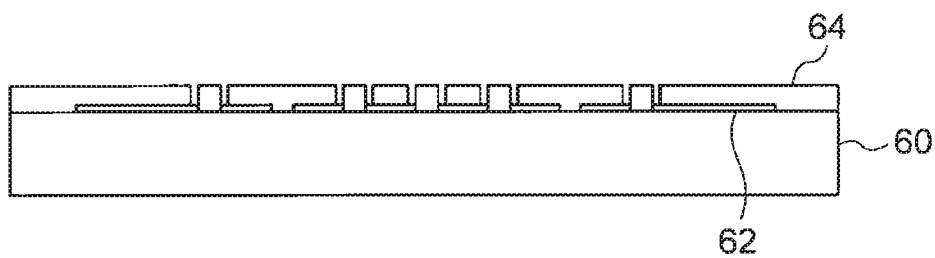

Next, as illustrated in FIG. 10D, the metal film 64 is patterned into a predetermined shape by photolithography and etching. As the etching, dry etching, wet etching, and the like are used without particular limitation.

Figure 10E:
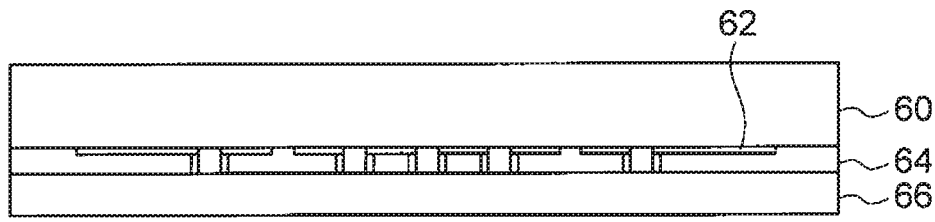

Next, as illustrated in FIG. 10E, an interlayer insulating film 66 is laminated on the base material 60 on which the metal film 64 is formed, and the interlayer insulating film 66 is thermally cured. As the interlayer insulating film 66, an interlayer insulating film to be used in a general build-up substrate can be used. Through this step, the metal film 64 on the base material 60 and the dielectric film 62 are displaced to the interlayer insulating film 66.

Figure 11A:
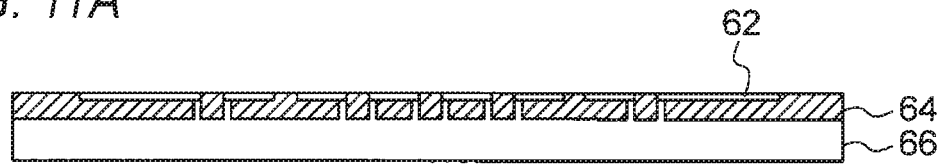
FIGS. 11A to 11E illustrate a part of the longitudinal sectional view illustrating an example of the method for manufacturing a circuit substrate according to the second exemplary embodiment.

Next, as illustrated in FIG. 11A, the base material 60 is removed. In the present exemplary embodiment, in this removing step, the base material 60 which is formed by Al is dissolved with a sodium hydroxide solution and is removed.

Figure 11B:
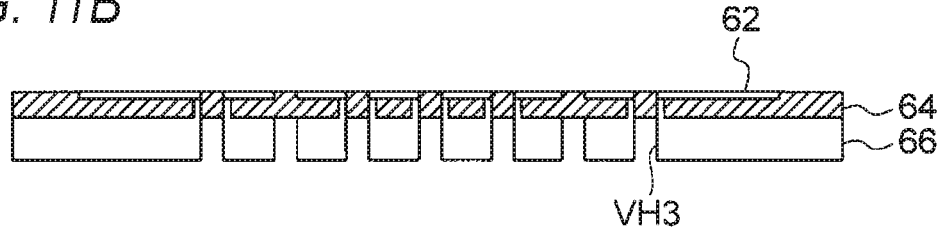

Next, as illustrated in FIG. 11B, a via hole VH3 is formed in a predetermined location of the interlayer insulating film 66 in the structure illustrated in FIG. 11A. The forming of the via hole VH3 is performed by a laser device, for example. The forming of the via hole VH3 according to the present exemplary embodiment is not limited to the laser device and may be performed using a drill.

Figure 11C:
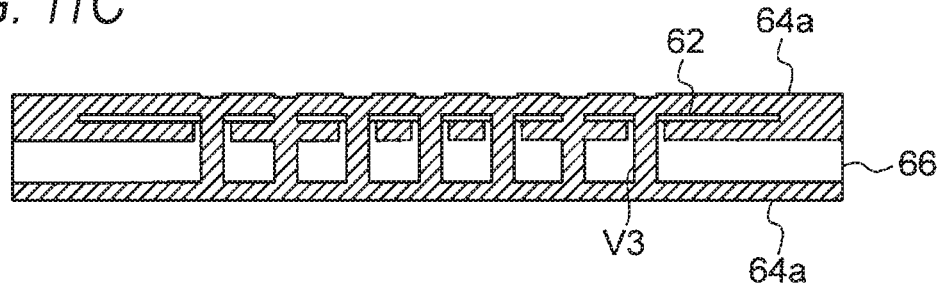

Next, as illustrated in FIG. 11C, a metal film 64a is formed on both surfaces of the structure illustrated in FIG. 11B and a via V3 is formed by embedding the via hole VH3 with the metal film 64a. As the material of the metal film 64a, Cu is used, for example. The deposition is performed using a dry plating method or an electrolytic plating method, for example.

Figure 11D:
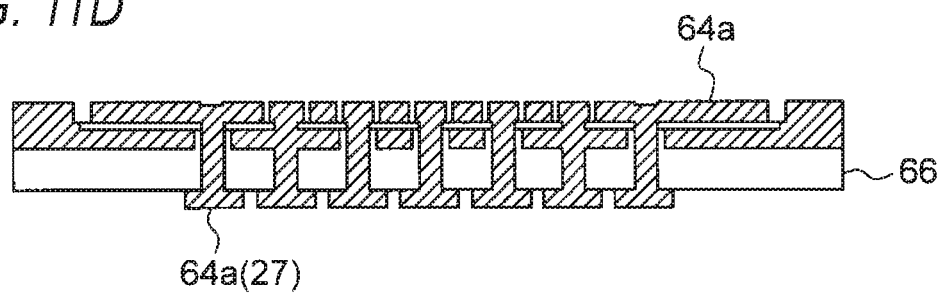

Thereafter, as illustrated in FIG. 11D, both sides of the metal film 64a of the structure illustrated in FIG. 11C is patterned into a predetermined shape by photolithography and etching. Through this step, the pad 27 (refer to FIG. 9) is formed on the back surface of the structure illustrated in FIG. 11D.

Figure 11E:
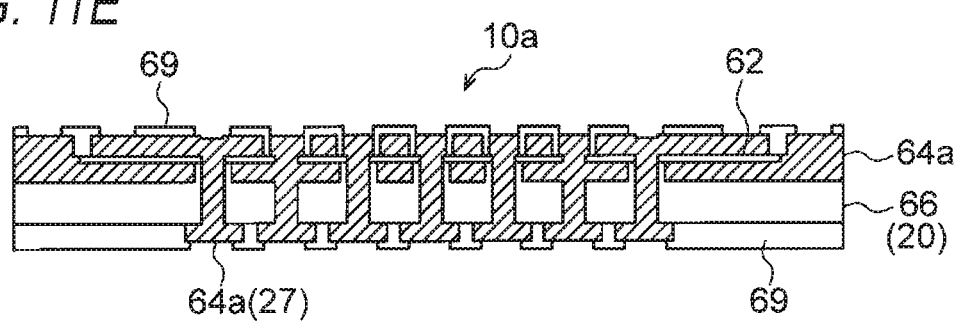

Next, as illustrated in FIG. 11E, an opening is provided at a predetermined location (a location of the electrode region which is connected to the terminal of the element or the like) by photolithography and a solder resist 69 serving as a resist film (insulating film) is formed. Through this step, manufacturing of the circuit substrate 10a according to the present exemplary embodiment is finished. In the circuit substrate 10a illustrated in FIG. 11E, the interlayer insulating film 66 becomes the interlayer insulating layer 20 illustrated in FIG. 9, a portion at the interlayer insulating film 66 side provided rather than the dielectric film 62 among the metal film 64a becomes the first metal layer 50 illustrated in FIG. 9, and a portion facing the interlayer insulating film 66 which is provided rather than the dielectric film 62 among the metal film 64a becomes the second metal layer 52 illustrated in FIG. 9.

Thereafter, in the same manner of FIG. 7C, a required element such as the semiconductor element 100 or the capacitor element 102 is mounted on the front surface (surface at the capacitor layer 12 side) of the circuit substrate 10a and the bump 24 is formed on the back surface of the circuit substrate 10a as needed (hereinabove, not illustrated).

In the above second exemplary embodiment, the circuit substrate 10a does not include the function for enlarging the connection pitch (pitch of the bump 106) of the semiconductor element 100. The pitch of the pad 27 of the back surface of the circuit substrate 10a is same as the pitch of the bump 106. On the other hand, the substrate 22 has a function of the interposer for enlarging the connection pitch. Therefore, the function as the capacitor layer is separated from the function as the interposer. With this configuration, for example, a new package substrate with the capacitor layer 12 can be obtained without the capacitor layer 12 and without largely changing the layer structure of the related package substrate (corresponds to the substrate 22) including only the interposer in design term.

Third Exemplary Embodiment

A circuit substrate 10b according to the present exemplary embodiment and a method for manufacturing the circuit substrate 10b will be described with reference to FIGS. 12 to 15B. The present exemplary embodiment is an aspect that the configuration of the capacitor layer 12 in the circuit substrate 10a illustrated in FIG. 9 is changed.

Figure 12:
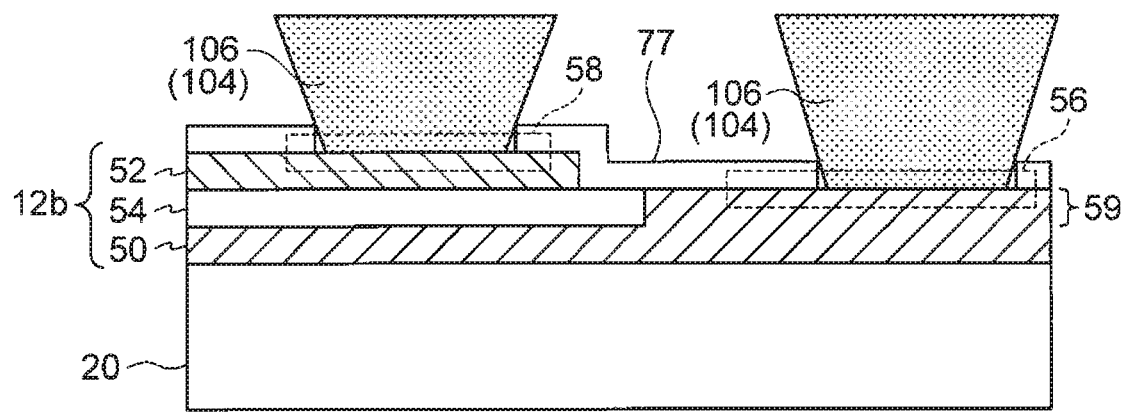
FIG. 12 is a schematic diagram for illustrating a capacitor layer according to a third exemplary embodiment.

As illustrated in FIG. 12, a capacitor layer 12b according to the present exemplary embodiment is configured by the first metal layer 50, the dielectric layer 54, and the second metal layer 52 which are laminated on the interlayer insulating layer 20 in this order. The capacitor layer 12b according to the present exemplary embodiment has an aspect that the position of the front surface of the first metal layer 50 in a thickness direction is identical to the position of the front surface (upper surface) of the dielectric layer 54 in the thickness direction.

The first metal layer 50 includes a projection portion 59 and the projection portion 59 includes the first electrode region 56 which is an element mounting region for mounting the element such as the semiconductor element 100 and the capacitor element 102. The second metal layer 52 does not include a projected portion such as the projection portion 59 and the second metal layer 52 itself includes the second electrode region 58 that is the element mounting region. In the capacitor layer 12b according to the present exemplary embodiment, the first electrode region 56 is projected from the upper surface of the first metal layer 50. In other words, the present exemplary embodiment is an aspect in which the first electrode region 56 is formed on the first metal layer 50. The front surface of the first electrode region 56 is exposed to the front surface of the circuit substrate at the same height as that of the position of the surface (upper surface) of the dielectric layer 54. The bump 106 of the semiconductor element 100 or the solder 104 of the capacitor element 102 is directly connected to the first electrode region 56 and the second electrode region 58, respectively. The "same height" here does not mean the completely same height. For example, the term "same height" includes a range in which as a result of manufacturing such that the patterns formed at the same height, the heights are shifted due to variations or the like.

Next, an example of the method for manufacturing the circuit substrate 10b will be described with reference with FIGS. 13A to 15B. In the method for manufacturing the circuit substrate 10b, the first metal layer 50 and the projection portion 59 (first electrode region 56) are formed in the same step at the same time, as the continued metal layer. As a result, an interface is not formed between the first metal layer 50 and the projection portion 59.

Figure 13A:
FIGS. 13A to 13E illustrate a part of the longitudinal sectional view illustrating an example of a method for manufacturing a circuit substrate according to the third exemplary embodiment.

Firstly, as illustrated in FIG. 13A, after forming the dielectric film 72 on the base material 70, the dielectric film 72 is patterned into a predetermined shape by photolithography and etching. As the base material 70, Al foil is used, for example. In addition, as the dielectric film 72, a STO film is used as an example. The STO film is formed in a thickness of above 500 nm by a CVD method, a PVD method, or the like, for example. As the etching, dry etching, wet etching, and the like are used without particular limitation.

Figure 13B:
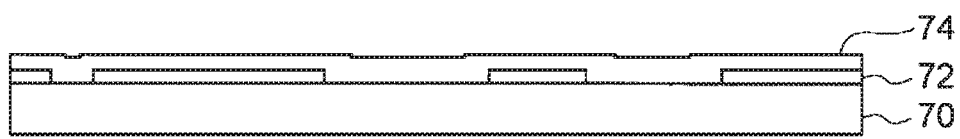

Next, as illustrated in FIG. 13B, a metal film 74 is formed. As the material of the metal film 74, Cu, Au, Al, or the like is used without particular limitation. In the present exemplary embodiment, Cu is used. The metal film 74 is formed to a thickness of about 1 μm to 20 μm by dry etching such as the CVD method or the PVD method. Here, in a region a dielectric film 72 is removed after patterning in the step of FIG. 13A, the metal films 74 are directly laminated on the base material 70 so as to bury between the dielectric films 72, and in the region in which the dielectric film 72 is remained, the metal films 74 are laminated on the dielectric film 72. As a result, the position at the lower surface side of the dielectric film 72 is identical to the position at the lower surface side of the region embedding between the dielectric films 72 among the metal film 74 in the front surface position of a base material 70.

Figure 13C:
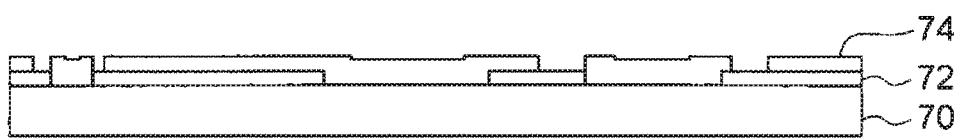

Next, as illustrated in FIG. 13C, the metal film 74 is patterned into a predetermined shape by photolithography and etching. As the etching, dry etching, wet etching, and the like are used without particular limitation.

Figure 13D:
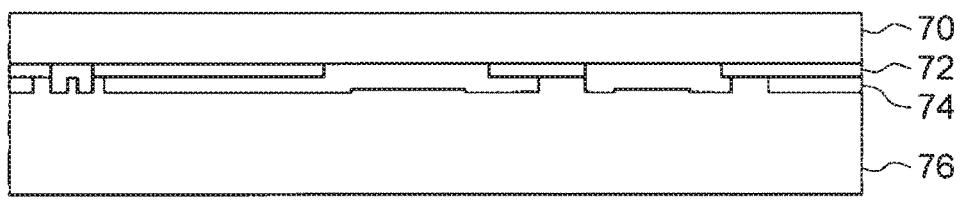

Next, as illustrated in FIG. 13D, the base material 70 on which the metal film 74 is formed is attached to the base material (interlayer insulating film 76) configuring the circuit substrate 10b, and the interlayer insulating film 76 is thermally cured. As the interlayer insulating film 76, an interlayer insulating film to be used in a general build-up substrate can be used. In the present exemplary embodiment, the interlayer insulating film 76 is used as the base material configuring the circuit substrate 10b. However, it is not necessary to form only a single film as the base material, and the base material may serve as the base material configuring the circuit substrate 10b by combining the interlayer insulating film 76 with the other base material.

Figure 13E:
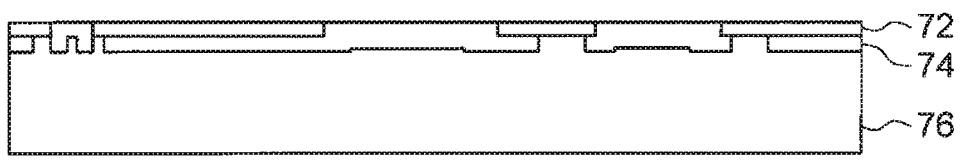

Next, as illustrated in FIG. 13E, the base material 70 is removed. Through this step, the metal film 74 on the base material 70 and the dielectric film 72 are displaced to the interlayer insulating film 76. In this removing step according to the present exemplary embodiment, the base material 70 which is formed by Al is dissolved with a sodium hydroxide solution and is removed. Here, in the previous step of FIG. 13B, the position of the dielectric film 72 at the lower surface side is identical to the position of the region for embedding between the dielectric films 72 among the metal film 74 at the lower surface side. Accordingly, when the base material 70 is removed by attaching the dielectric film 72 to the interlayer insulating film 76 so as to be closer to the inner layer side than the metal film 74, the position of the upper surface of the dielectric film 72 is identical to the position of the upper surface of the region (a region projecting from the metal film 74) where between the dielectric films 72 is embedded among the metal film 74 in the thickness direction. As described above, the steps of FIGS. 13A to 13E are performed in the same manner of the first exemplary embodiment.

Figure 14A:
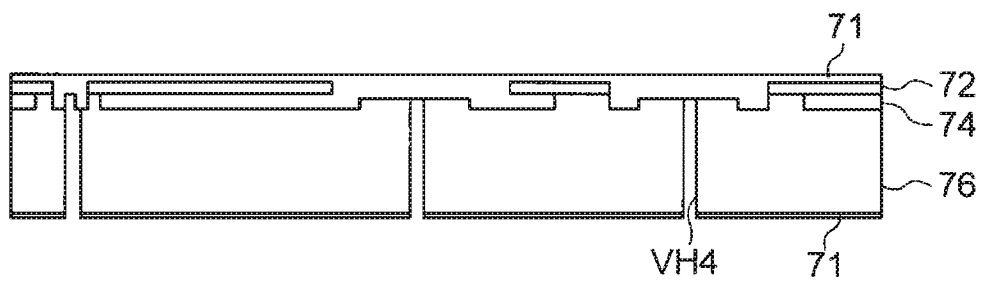
FIGS. 14A to 14D illustrate a part of the longitudinal sectional view illustrating an example of the method for manufacturing a circuit substrate according to the third exemplary embodiment.

Next, as illustrated in FIG. 14A, after a via hole VH4 is formed on the interlayer insulating film 76 of the structure illustrated in FIG. 13E from the back surface side of the interlayer insulating film 76, a metal film 71 as a seed layer is formed on both sides of the structure. The forming of the via hole VH4 is performed by a laser device or a drill, for example. As the material of the deposition of the metal film 71, Cu is used, for example. As an example the deposition of the metal film 71 is performed by a dry etching method such as the CVD method or the PVD method. In this case, the metal film 71 as the seed layer is also formed inside the via hole VH4 (not illustrated).

Figure 14B:
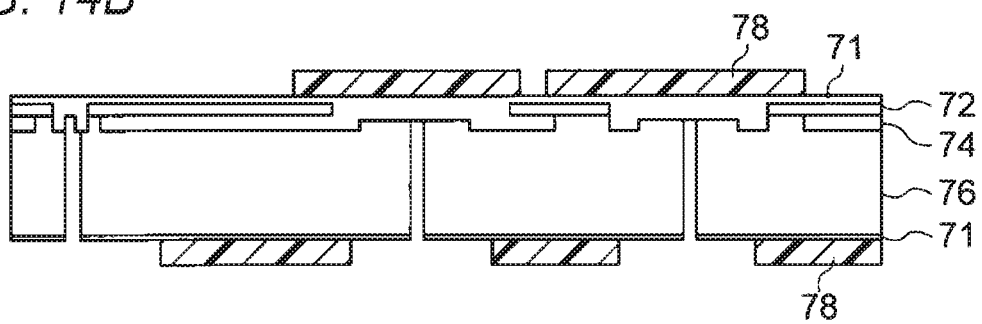

Next, as illustrated in FIG. 14B, a resist 78 is patterned into a predetermined shape by photolithography and etching on a region in which an electrolytic plating is not performed in the post-step (a region in which a metal film 71a is not formed).

Figure 14C:
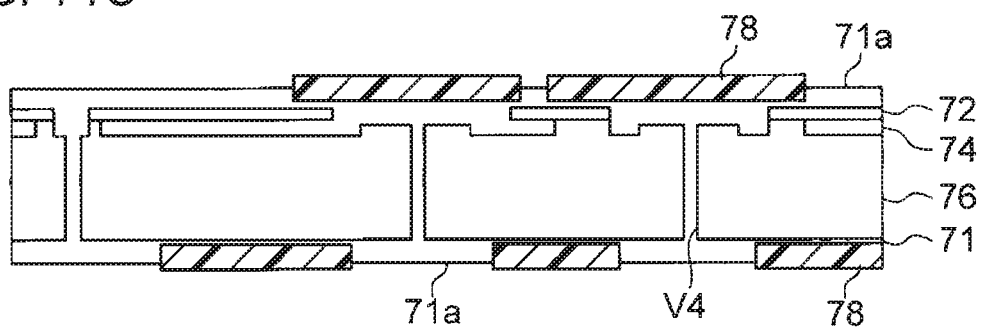

Next, as illustrated in FIG. 14C, the metal film 71a is formed by performing electrolytic plating. Through this step, the via hole VH4 is also embedded, and a via V4 is formed. As the material of the metal film 71a, Cu, Au, Al, or the like is used without particular limitation. In the present exemplary embodiment, Cu is used. In addition, the thickness of the metal film 71a is about 1 μm to 20 μm, as an example. The metal film 71a in this step, the second metal layer 52 of the capacitor layer 12 and the pad 27 of the interlayer insulating layer 20 are formed through the post-step.

Figure 14D:
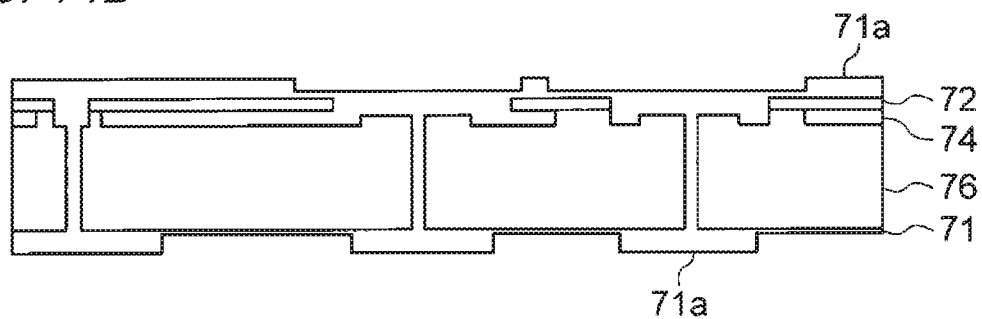

Next, as illustrated in FIG. 14D, the resist 78 is removed. In this state, the metal film 71 (seed layer) still remains, and entire both surfaces of the structure illustrated in FIG. 14D is covered with Cu.

Figure 15A:
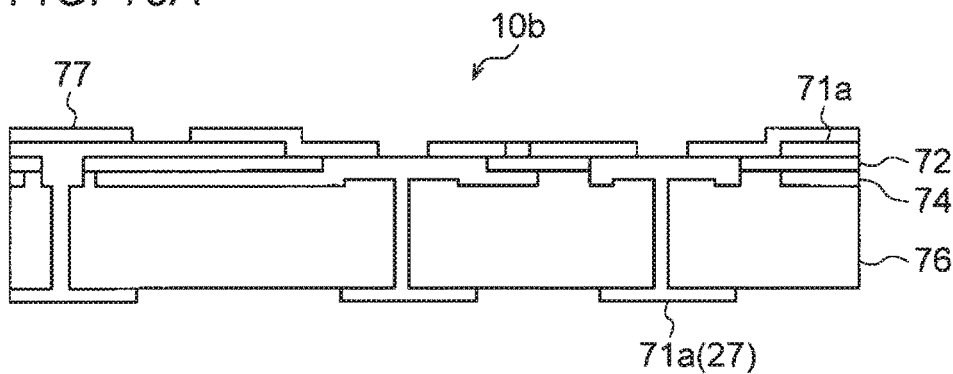
FIGS. 15A and 15B illustrate a part of the longitudinal sectional view illustrating an example of the method for manufacturing a circuit substrate according to the third exemplary embodiment.

Next, as illustrated in FIG. 15A, entire the surfaces of the structure illustrated in FIG. 14D is subjected to etching so as to remove the metal film by at least the thickness of the metal film 71 (seed layer). Through this step, the first metal layer 50 of the capacitor layer 12 is electrically separated from the second metal layer 52. In addition, in the back surface side of the base material 70, the pad 27 (refer to FIG. 9) is separated into each of the pads at the back surface side. Depending on the etching amount of the metal film 71 (seed layer), there is a case where the position of the front surface of the first electrode region 56 is lower than the position of the front surface (upper surface) of the dielectric layer 54 as the structure of FIG. 20A or FIG. 20B.

Next, an opening is provided at a predetermined location (a location of the electrode region which is connected to the terminal of the element or the like) by photolithography and etching and a solder resist 77 serving as a resist film (insulating film) is formed. Through this step, manufacturing of the circuit substrate 10b according to the present exemplary embodiment is finished.

Figure 15B:
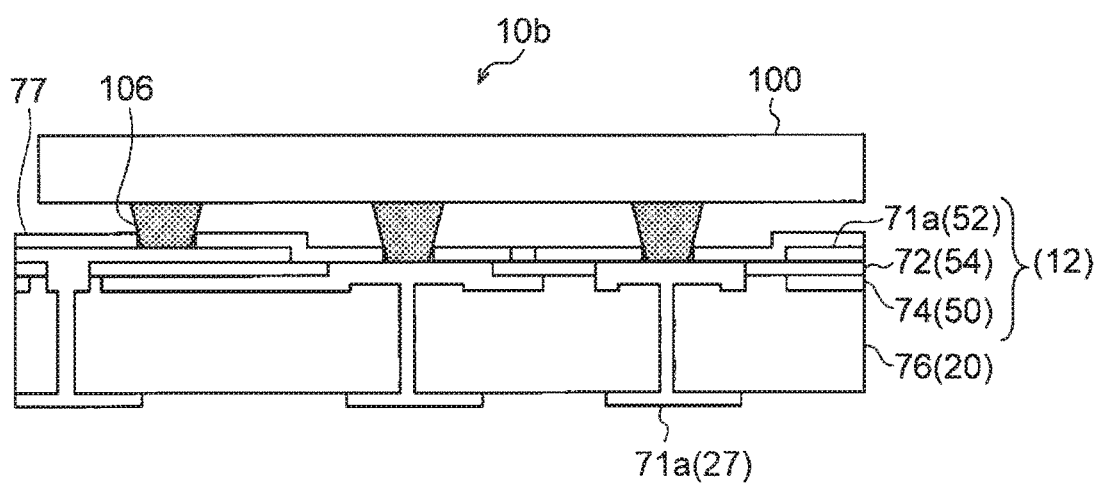

Next, as illustrated in FIG. 15B, a required element such as the semiconductor element 100 or the capacitor element 102 is mounted on the front surface (surface at the capacitor layer 12 side) of the circuit substrate 10b and the bump 24 is formed on the back surface of the circuit substrate 10b as needed (hereinabove, not illustrated). As illustrated in FIG. 15B, each of the metal film 74, the dielectric film 72, the metal film 71a, and the interlayer insulating film 76 of FIG. 15B is set as the first metal layer 50, the dielectric layer 54, the second metal layer 52, and the interlayer insulating layer 20 which are illustrated in FIG. 12.

Fourth Exemplary Embodiment

A circuit substrate 10c according to the present exemplary embodiment and a method for manufacturing the circuit substrate 10c will be described with reference to FIGS. 16 to 19B. The present exemplary embodiment is an aspect that the configuration of the capacitor layer 12 in the circuit substrate 10 illustrated in FIG. 2 is changed.

Figure 16:
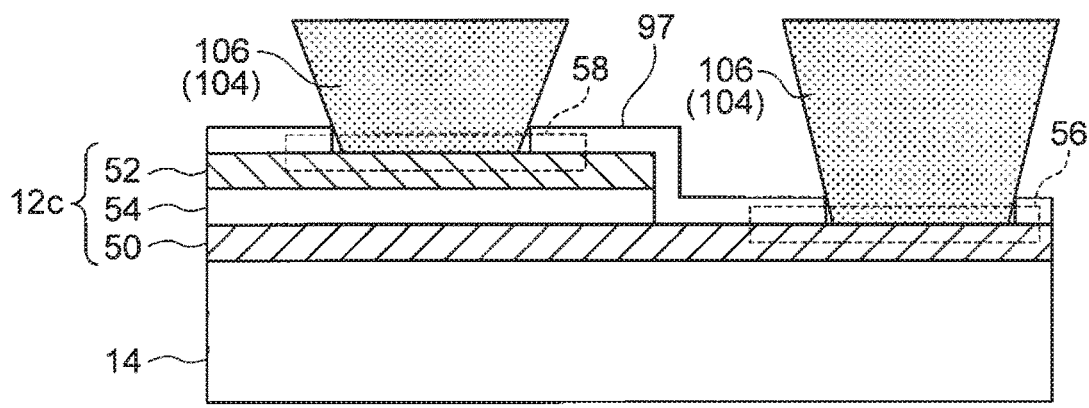
FIG. 16 is a schematic diagram for illustrating a capacitor layer according to a fourth exemplary embodiment.

As illustrated in FIG. 16, the capacitor layer 12c according to the present exemplary embodiment is configured by the first metal layer 50, the dielectric layer 54, and the second metal layer 52 which are laminated on the substrate 14 in this order. In the capacitor layer 12c, the position of the front surface of the first metal layer 50 in the thickness direction is exposed to the front surface of the substrate in the position of the lower surface of the dielectric layer 54 in the thickness direction. In other words, the first electrode region 56 is not projected upwardly, and the front surface of the first metal layer 50 includes the first electrode region 56. In this manner, the present exemplary embodiment includes an aspect that the first metal layer 50 is exposed to the front surface of the substrate in a position lower than the position of the upper surface of the dielectric layer 54 and is an example of an aspect that the first electrode region 56 is exposed to the front surface of the substrate in the position lower than the position of the upper surface of the dielectric layer 54 in the thickness direction. The bump 106 of the semiconductor element 100 or the solder 104 of the capacitor element 102 is directly connected to the first electrode region 56 and the second electrode region 58, respectively. It is not necessary to match the position of the front surface of the first metal layer 50 in the thickness direction with the position of the lower surface of the dielectric layer 54 in the thickness direction, completely. For example, the position may include a range in which the position thereof is shifted due to the manufacturing variation or the like.

An example of the method for manufacturing a circuit substrate 10c will be described with reference with FIGS. 17A to 19B. In the method for manufacturing the circuit substrate 10c according to the present exemplary embodiment, the first metal layer 50 and the first electrode region 56 are formed in the same step at the same time, as the continued metal layer.

Figure 17A:
FIGS. 17A to 17E illustrate a part of the longitudinal sectional view illustrating an example of a method for manufacturing a circuit substrate according to the fourth exemplary embodiment.

Firstly, as illustrated in FIG. 17A, a sheet shaped metal film 91 and a dielectric film 92 are attached to the base material 90. As the base material 90, a glass epoxy substrate is used, for example. In addition, as the material of the metal film 91, Cu, Au, Al, or the like is used without particular limitation. In the present exemplary embodiment, Cu is used. The metal film 91 and the dielectric film 92 are formed on the base material 90 using the other method as described in the first exemplary embodiment.

As the dielectric film 92, for example, a resin thin film such as polyimide and the other materials which are commercially available as the embedding capacitor dedicate material is used. The thickness is about 1 μm to 10 μm, for example. In addition, in the same manner as the first exemplary embodiment, the STO film may be used.

Figure 17B:
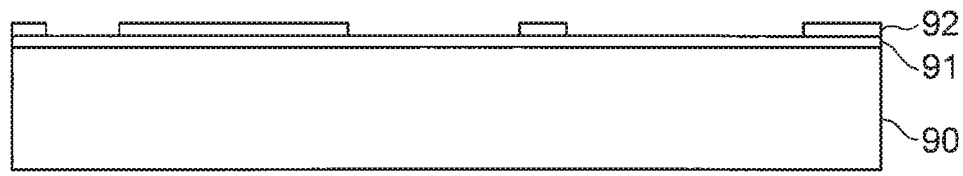

Next, as illustrated in FIG. 17B, the dielectric film 92 is patterned into a predetermined shape by photolithography and etching. As the etching, dry etching, wet etching, and the like are used without particular limitation.

Figure 17C:
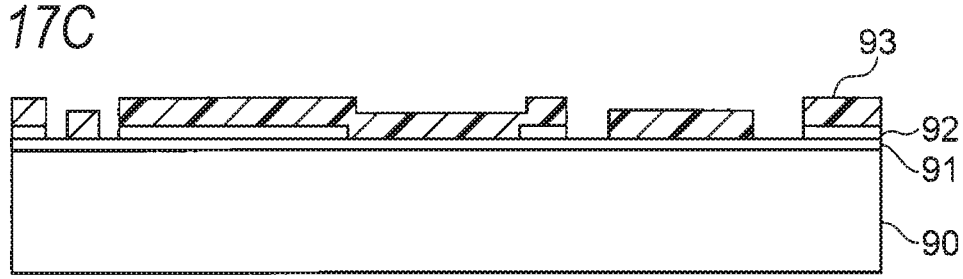

Next, after coating a resist 93 for patterning the metal film 91, as illustrated in FIG. 17C, the resist 93 corresponding to the region other than the region of the metal film 91 which is remained as the wiring layer and the mask is formed by photolithography and etching.

Figure 17D:
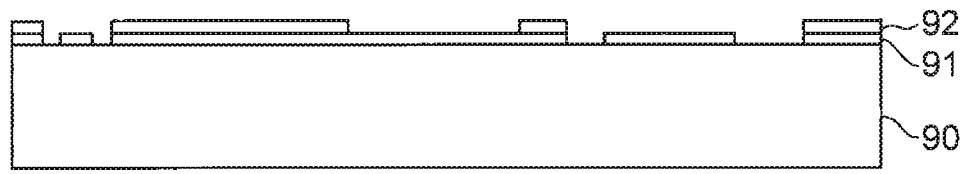

Next, as illustrated in FIG. 17D, the metal film 91 is subjected to etching using the mask. Thereafter, the mask (resist 93) is removed.

Figure 17E:
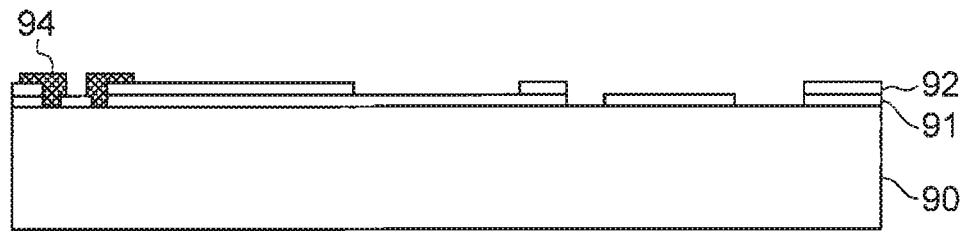

Next, as illustrated in FIG. 17E, an insulating layer 94 is formed in a location where the metal film 91 is connected to a metal film 96 to be described by photolithography and etching.

Figure 18A:
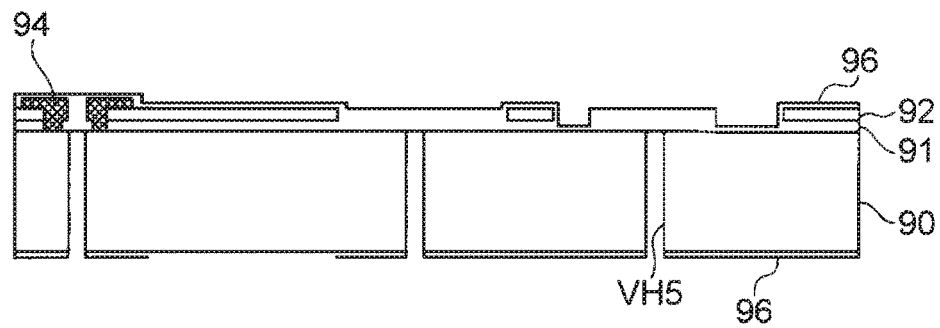
FIGS. 18A to 18D illustrate a part of the longitudinal sectional view illustrating an example of the method for manufacturing a circuit substrate according to the fourth exemplary embodiment.

Next, as illustrated in FIG. 18A, after a via hole VH5 is formed on the base material 90 of the structure illustrated in FIG. 17E from the back surface side, the metal film 96 as a seed layer is formed on both sides of the structure. The forming of the via hole VH5 is performed by a laser device or a drill, for example. As the material of the deposition of the metal film 96, Cu is used, for example. As an example the deposition of the metal film 96 is performed by a dry etching method such as the CVD method or the PVD method. In this case, the metal film 96 as the seed layer is also formed inside the via hole VH5 (not illustrated).

Figure 18B:
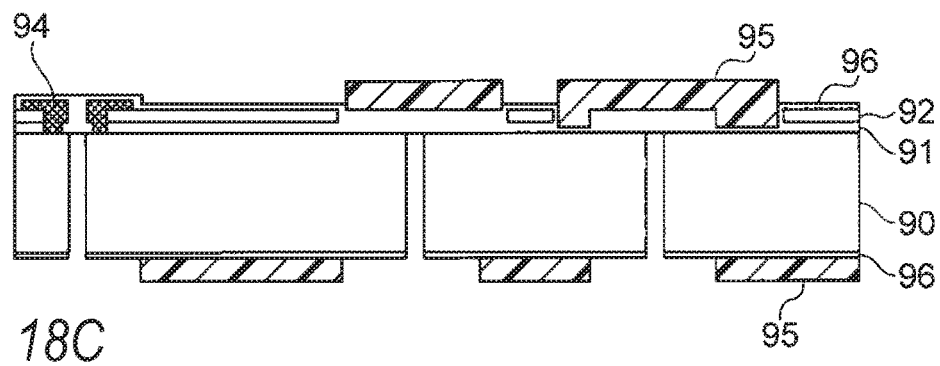

Next, as illustrated in FIG. 18B, a resist 95 is patterned into a predetermined shape by photolithography and etching on a region in which an electrolytic plating is not performed in the post-step (a region in which a metal film 96a is not formed).

Figure 18C:
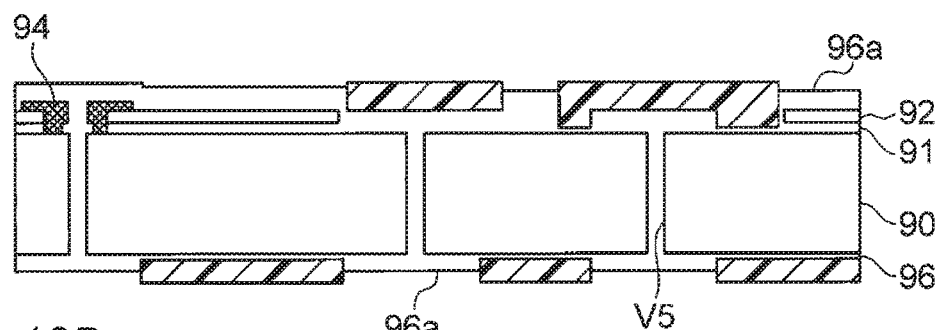

Next, a as illustrated in FIG. 18C, the metal film 96a is formed by performing electrolytic plating. Through this step, the via hole VH5 is also embedded, and a via V5 is formed. As the material of the metal film 96a, Cu, Au, Al, or the like is used without particular limitation. In the present exemplary embodiment, Cu is used. In addition, the thickness of the metal film 96a is about 1 μm to 20 μm, as an example. The metal film 96a in this step, the second metal layer 52 of the capacitor layer 12 and the pad 16 (refer to FIG. 2) of substrate 14 are formed through the post-step.

Figure 18D:
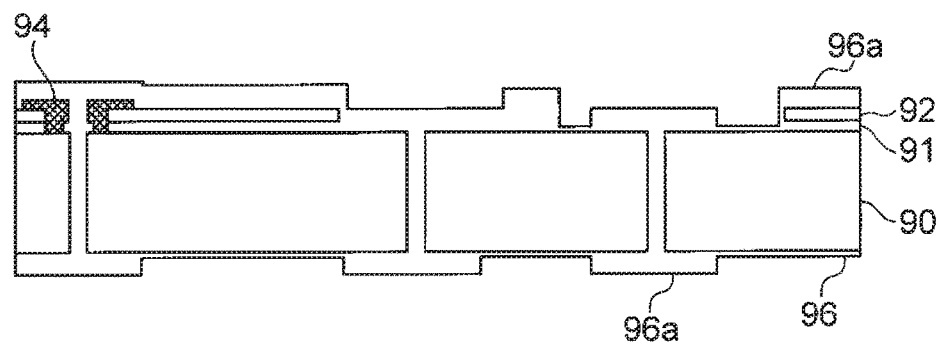

Next, as illustrated in FIG. 18D, the resist 95 is removed. In this state, the metal film 96 (seed layer) still remains, and entire both surfaces of the structure illustrated in FIG. 18D is covered with Cu.

Figure 19A:
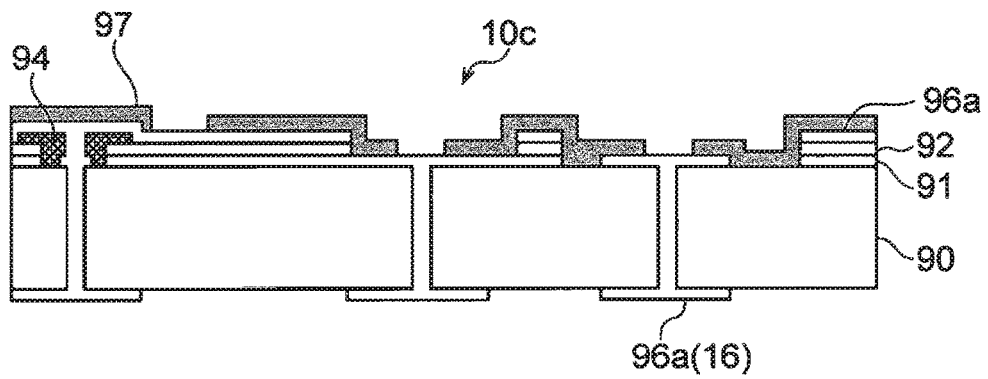
FIGS. 19A and 19B illustrate a part of the longitudinal sectional view illustrating an example of the method for manufacturing a circuit substrate according to the fourth exemplary embodiment.

Next, as illustrated in FIG. 19A, entire the surfaces of the structure illustrated in FIG. 18D is subjected to etching so as to remove the metal film by at least the thickness of the metal film 96 (seed layer). Through this step, the wiring layer of the both surface of the circuit substrate 10c, that is, the second metal layer 52 of the capacitor layer 12 and the pad 16 of the substrate 14 are formed. Depending on the etching amount of the metal film 96 (seed layer), there is a case where the position of the front surface of the first electrode region 56 is lower than the position of the bottom surface (lower surface) of the dielectric layer 54 as the structure of FIG. 20B.

Next, an opening is provided at a predetermined location (a location of the electrode region which is connected to the terminal of the element or the like) by photolithography and etching and a solder resist 97 serving as a resist film (insulating film) is formed. Through this step, manufacturing of the circuit substrate 10c according to the present exemplary embodiment is finished.

Figure 19B:
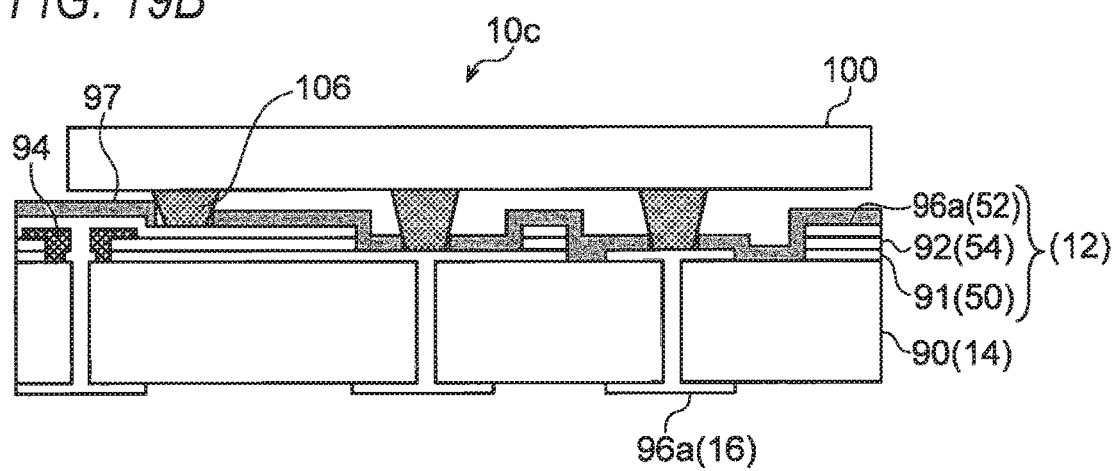

Next, as illustrated in FIG. 19B, a required element such as the semiconductor element 100 or the capacitor element 102 is mounted on the front surface (surface at the capacitor layer 12 side) of the circuit substrate 10c and the bump 18 is formed on the back surface of the circuit substrate 10c as needed (hereinabove, not illustrated).

As illustrated in FIG. 19B, each of the metal film 91, the dielectric film 92, the metal film 96a, and the base material 90 of FIG. 19B is set as the first metal layer 50, the dielectric layer 54, the second metal layer 52, and the substrate 14 which are illustrated in FIG. 16.

As described above, the third and fourth exemplary embodiments are different from the first and second exemplary embodiments. A step between the second metal layer 52 and the first electrode region 56 occurs (refer to FIG. 12, FIG. 16, or the like). Accordingly, in comparison to the first and second exemplary embodiments in which the front surface of the first electrode region 56 is exposed in the position higher than the dielectric layer 54, the terminal of the capacitor element 102 or the terminal of the circuit part to be mounted is connected at a position closer than the first metal layer 50 configuring the capacitor layer.

In addition, in the third and fourth exemplary embodiment, a part of the first metal layer 50 configures the first electrode region 56 and the first metal layer 50 and the first electrode region 56 are formed in the same step at the same time as the continued metal layer. On the other hand, in the first and second exemplary embodiments, after the first metal layer 50 is formed, the first electrode region 56 is configured on the first metal layer 50 in the different step. In the third and the fourth exemplary embodiment, since the first metal layer 50 and the first electrode region 56 are formed in the same step at the same time, there is no interface between the first metal layer 50 and the first electrode region 56. Accordingly, in comparison to the configuration in which b forming the first metal layer 50 and the first electrode region 56 in the different steps, the impedance from the first metal layer 50 to the first electrode region 56 becomes smaller.

A step between the second metal layer 52 and the first electrode region 56 becomes greater as the thickness of the second metal layer 52 becomes greater in FIG. 12. In addition, the step between the second metal layer 52 and the first electrode region 56 becomes greater as the thicknesses of the second metal layer 52 and the dielectric layer 54 become greater, in FIG. 16. Here, the material of the bump 106 is configured of Au, for example, and the height of the bump before connection is about 15 to 50 μm, for example. On the other hand, the second metal layer 52 is mechanically sufficiently, even when the thickness of the second metal layer 52 is about 1 to 2 μm. In addition, the dielectric layer 54 can be formed with a thickness of 1 μm or less by the vapor deposition method or the like. Therefore, steps in the third and fourth exemplary embodiments can be configured so as not to become larger with respect to the height of the bump 106. Accordingly, even if the plural bumps 106 which are provided on the semiconductor element 100 have the same height, the step does not become a large obstacle when the semiconductor element 100 or the like is mounted. In other words, when the semiconductor element including plural bumps having the same height is mounted on the circuit substrate, a design is performed so as to have the relationship between the size (thickness of the layer) of the step in which there is no failure on the connection and the height of the bump.

In the above first exemplary embodiment, as illustrated in FIG. 3, it is described as an example of the aspect in which the position of the upper surface of the first electrode region 56 which is formed on the first metal layer 50 is identical to the position of the upper surface of the second metal layer 52, in the above third exemplary embodiment, as illustrated in FIG. 12, it is described as an example of the aspect in which the position o the upper surface of the first electrode region 56 which is formed on the first metal layer 50 is identical to the position of the upper surface of the dielectric layer 54, and in the above fourth exemplary embodiment, as illustrated in FIG. 16, it is described an example of the aspect in which the position of the upper surface of the first electrode region 56 that is a part of the first metal layer 50 is identical to the position of the lower surface of the dielectric layer 54. However, the relationship between the position of the first electrode region 56 in the thickness direction and the position of the dielectric layer 54 in the thickness direction is not limited thereto. For example, there is a case where the positional relationship between the first electrode region 56, the dielectric layer 54, and the second electrode region 58 in the each exemplary embodiment is changed due to the manufacturing variation of the first metal layer 50, the second metal layer 52, and the dielectric layer 54 and the restrictions in terms of design and manufacturing.

Figure 20A:
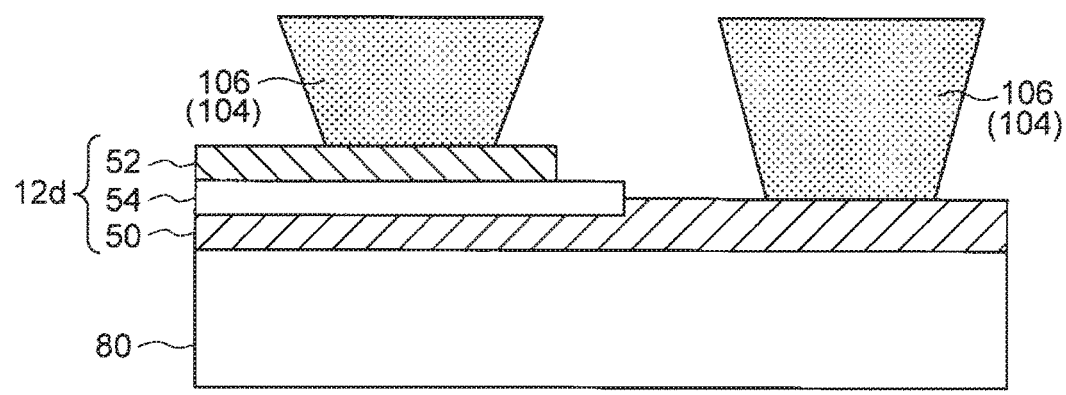
FIGS. 20A and 20B are schematic diagrams for illustrating a manufacturing variation of the capacitor layer according to the exemplary embodiments.
Figure 20B:
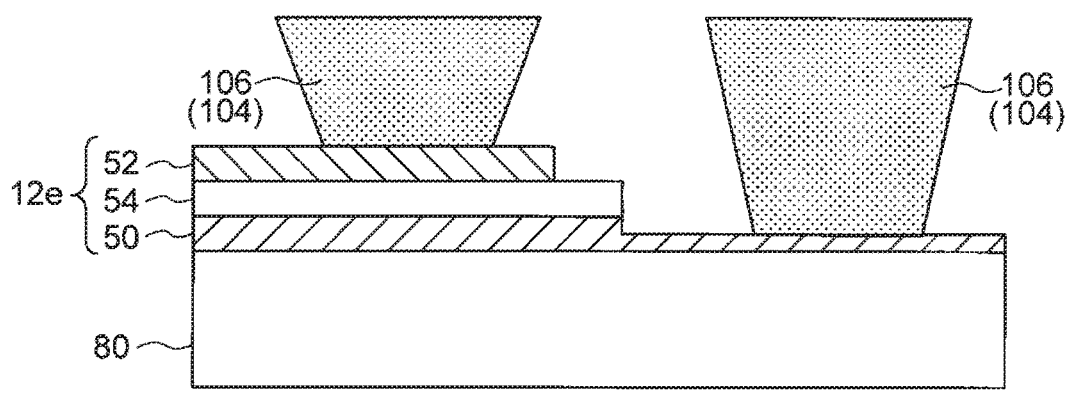

That is, for example, there is a case where the upper surface of the first electrode region 56 illustrated in FIG. 12 is positioned in a range (between the upper surface and the lower surface of the dielectric layer 54) of the dielectric layer 54 in the thickness direction as illustrated in FIG. 20A due to the manufacturing variation of each layer and the restrictions in terms of design and manufacturing. Furthermore, as illustrated in FIG. 20B, there is a case where the upper surface is positioned in a range (a range lower than the upper surface of the first metal layer 50 and a range higher than the upper surface of the base material 80) of the first metal layer 50 in the thickness direction. In addition, there is a case where the upper surface of the first electrode region illustrated in FIG. 16 is positioned in a range (a range lower than the upper surface of the first metal layer 50 and higher than the upper surface of the base material 80) of the first metal layer 50 in the thickness direction as illustrated in FIG. 20B due to the manufacturing variations of each layer. Therefore, the exemplary embodiments include such as a variation in the position.

Although the exemplary embodiments of the present invention have been described in detail, the present invention is not to be limited to specific exemplary embodiments, and various modifications and alternations can be made without departing from the scope and the spirit of the invention. That is, for example, the structures, the materials, the processes, and the like disclosed in a certain exemplary embodiment may be applied to the other exemplary embodiments as long as no technical conflict occurs therein. As an example, the capacitor layer in the second exemplary embodiment may be manufactured in the third and fourth exemplary embodiments.

In addition, the capacitor layer including the metal layer and the dielectric layer in the exemplary embodiments may not be formed such that the range of the semiconductor element is spread in the circuit substrate, and it may be formed only on a part of the circuit substrate. As an example, it may be formed as a wiring having a width of 500 μm or more which is sufficiently wider than the common wiring width. In addition, in a case where there is no space, it may be configured by the wiring having a width less than 500 μm. In addition, one of the first metal layer 50 and the second metal layer 52 may be a plane-shaped metal surface having a width of 500 μm or more and the other may be a metal surface having a width less than 500 μm.

In addition, the power supply potential layer and the standard potential layer in the exemplary embodiments may be divided into the plural regions, respectively. In addition, only one of the power supply potential layer and the standard potential layer may be divided into the plural regions.

In addition, each metal layer configuring the capacitor layer is not necessary formed as a single layer. For example, a functional layer which is formed of the other metal having a thickness thinner than the metal layer may be laminated on a front surface or a back surface of the single metal layer to be a base.

In addition, in the first exemplary embodiment, the position of the upper surface of the first electrode region 56 may not necessary be the same position as the position of the upper surface of the second electrode region 58. That is, both the first electrode region 56 and the second electrode region 58 may be positioned on a position higher than the position of the upper surface of the dielectric layer 54. In addition, the "upper surface" in the exemplary embodiments indicates an upper surface in a case where it is assumed that the capacitor layer 12 is positioned on the upper with respect to the substrate 14.

As a modification example of the exemplary embodiment of the present invention, the circuit substrate 10a having the configuration which the same pitches of the electrode in the two sides are provided which is disclosed in the second exemplary embodiment may be also applied to the configuration other than the capacitor layers which are disclosed in the first to fourth exemplary embodiments. That is, as the circuit substrate 10a which is disclosed in the second exemplary embodiment, is may be applied to a circuit substrate including the capacitor layer in the inner layer without the front surface or a circuit substrate including a capacitor element in the inner layer in place of the capacitor layer.

In the exemplary embodiments, the height position of the electrode for a signal is arbitrary. By matching the heights to any of the electrode for a power supply potential and the electrode for a standard potential, the manufacturing process is simplified as compared to a case where the height is different from the electrode.

It should be noted that the scales and the shapes of the drawings may be emphasized for easily understanding the features of the invention, and are not necessarily the same as the scales or the shapes of the actual substrate.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A circuit substrate comprising:
   a base material; and
   a capacitor layer including:
      a first metal layer on the base material;
      a dielectric layer on the first metal layer; and
      a second metal layer on the dielectric layer,
   wherein the first metal layer includes a first electrode region on the base material, which is exposed from the dielectric layer and to which a first terminal of a capacitor element for supplying current to a circuit through the capacitor layer is to be connected, and
   wherein the second metal layer includes a second electrode region in which the second metal layer is exposed and to which a second terminal of the capacitor element is to be connected.

2. The circuit substrate according to claim 1,
   wherein the first metal layer includes a projection portion projecting from a height position of a lower surface of the dielectric layer toward the first electrode region, and
   wherein the circuit substrate is configured without any interfaces between the first metal layer and the projection portion.

3. The circuit substrate according to claim 1,
   wherein the first electrode region is exposed at a height position of an upper surface of the dielectric layer or at a position lower than the height position of the upper surface of the dielectric layer.

4. The circuit substrate according to claim 1,
   wherein the first electrode region is exposed at a height position of an upper surface of the dielectric layer.

5. The circuit substrate according to claim 1,
   wherein the first electrode region is exposed at a height position of a lower surface of the dielectric layer or at a position lower than the height position of the lower surface of the dielectric layer.

6. The circuit substrate according to claim 5,
   wherein the first electrode region is exposed at the height position of the lower surface of the dielectric layer.

7. The circuit substrate according to claim 1,
   wherein the second electrode region is exposed at a position higher than a height position of an upper surface of the dielectric layer.

8. The circuit substrate according to claim 1,
   wherein the first metal layer includes a third electrode region which is exposed from the dielectric layer and to which one of a terminal for a power supply potential and a terminal for a standard potential that are included in the circuit is connected, and wherein the second metal layer includes a fourth electrode region in which the second metal layer is exposed and to which other of the terminal for a power supply potential and the terminal for a standard potential is connected.

9. The circuit substrate according to claim 8,
wherein the capacitor element is connected to the first electrode region and the second electrode region, and
wherein a semiconductor integrated circuit as the circuit is connected to the third electrode region and the fourth electrode region.

10. The circuit substrate according to claim 8, further comprising:
a first conductive portion for connecting the first metal layer to one of an external power supply potential and a standard potential which is extended from a vicinity of the first electrode region toward an inner layer side of the base material;
a second conductive portion for connecting the second metal layer to other of the external power supply potential and the standard potential which is extended from a vicinity of the second electrode region toward the inner layer side of the base material;
a third conductive portion for connecting the first metal layer to one of the external power supply potential and the standard potential which is extended from a vicinity of the third electrode region toward the inner layer side of the base material; and
a fourth conductive portion for connecting the second metal layer to other of the external power supply potential and the standard potential which is extended from a vicinity of the fourth electrode region toward the inner layer side of the base material.

11. The circuit substrate according to claim 10,
wherein, in a case where the base material is viewed through from one surface side, at least one conductive portion among the first to fourth conductive portions is connected to the first metal layer or the second metal layer in a position which overlaps a corresponding electrode region.

12. The circuit substrate according to claim 10,
wherein in a case where the base material is viewed through from one surface side, the first to the fourth conductive portions are connected to the first metal layer and the second metal layer respectively, in a position which overlaps a corresponding electrode region.

13. The circuit substrate according to claim 1,
wherein the first metal layer includes a third electrode region which is exposed from the dielectric layer and to which one of a terminal for power supply potential and a terminal for a standard potential which are included in the circuit is connected,
wherein the second metal layer includes a fourth electrode region in which the second metal layer is exposed and to which other of the terminal for a power supply potential and the terminal for a standard potential is connected,
wherein the third electrode region is exposed at a position higher than a height position of an upper surface of the dielectric layer, and
wherein the first metal layer and the third electrode region are connected to each other through a conductive portion which passes through the first metal layer and the dielectric layer and does not have an interface.

14. The circuit substrate according to claim 8,
wherein the base material includes a plurality of electrode regions at a front surface side including the third and the fourth electrode regions, and a plurality of electrode regions at a back surface side which are electrically connected to the plurality of electrode regions at the front surface side, respectively, through an inner portion of the base material, and
wherein a distance between the plurality of electrode regions at the front surface side is equal to a distance between the plurality of electrode regions at the back surface side.

15. The circuit substrate according to claim 8,
wherein the base material includes a plurality of electrode regions at a front surface side including the third and the fourth electrode regions, and a plurality of electrode regions at a back surface side which are electrically connected to the plurality of electrode regions at the front surface side, respectively, through an inner portion of the base material, and
wherein each of the plurality of electrode regions at the front surface side to which the circuit is connected and the plurality of electrode regions at the back surface side corresponding to each electrode regions are provided on an overlapping position in a case where the base material is viewed through from one surface side.

16. The circuit substrate according to claim 1, wherein, in a direction from the base material to the circuit, the first metal layer is both in direct contact with a face of the dielectric layer facing away from the circuit and also in direct contact with a face of the dielectric layer facing towards the circuit.

17. The circuit substrate according to claim 1, wherein, in a direction from the base material to the circuit, the first metal layer and the second metal layer connect to the circuit at positions equal in distance from the base material.

18. The circuit substrate according to claim 1, wherein each of the capacitor element and circuit is positioned further away from the base material than each of the first metal layer, dielectric layer, second metal layer, first electrode region and second electrode region.

19. The circuit substrate according to claim 1,
wherein the second electrode region is configured to directly contact the second terminal of the capacitor element.

20. The circuit substrate according to claim 1,
wherein a solder resist is formed on the second metal layer and the second electrode region is exposed from the solder resist.

* * * * *